(12) United States Patent
Heubach et al.

(10) Patent No.: US 10,578,674 B2
(45) Date of Patent: Mar. 3, 2020

(54) PERSONAL CONSUMER PRODUCT WITH THERMAL CONTROL CIRCUITRY DIAGNOSTICS AND METHODS THEREOF

(71) Applicant: The Gillette Company, Boston, MA (US)

(72) Inventors: Klaus Heubach, Koenigstein (DE); Norbert Broemse, Bad Homburg (DE); Timo Schmitt, Hintertiefenbach (DE); Felix Koenig, Darmstadt (DE)

(73) Assignee: The Gillette Company LLC, Boston, MA (US)

( * ) Notice: Subject to any disclaimer, the term of this patent is extended or adjusted under 35 U.S.C. 154(b) by 16 days.

(21) Appl. No.: 15/189,282

(22) Filed: Jun. 22, 2016

(65) Prior Publication Data
US 2017/0370992 A1 Dec. 28, 2017

(51) Int. Cl.
| | | |
|---|---|---|
| *G01R 31/327* | (2006.01) | |
| *H05B 1/02* | (2006.01) | |
| *B26B 21/40* | (2006.01) | |
| *B26B 21/48* | (2006.01) | |

(52) U.S. Cl.
CPC ......... *G01R 31/327* (2013.01); *H05B 1/0252* (2013.01); *B26B 21/4056* (2013.01); *B26B 21/48* (2013.01)

(58) Field of Classification Search
CPC ............... G01R 31/327; H05B 1/0252; B26B 21/4056; B26B 21/48
USPC ................................................ 324/415–424
See application file for complete search history.

(56) References Cited

U.S. PATENT DOCUMENTS

| | | | |
|---|---|---|---|
| 5,383,350 A * | 1/1995 | Bennett | F02P 3/02 324/391 |
| 5,653,025 A | 8/1997 | Cheng et al. | |
| 6,112,135 A | 8/2000 | Peterson | |
| 6,246,831 B1 * | 6/2001 | Seitz | F24H 9/2021 219/483 |
| 8,183,940 B2 | 5/2012 | Koyama et al. | |
| 8,186,063 B2 | 5/2012 | Clarke | |
| 8,481,898 B2 | 7/2013 | Parker | |
| 8,772,679 B2 | 7/2014 | Novikov | |
| 9,071,073 B2 | 6/2015 | Bourilkov et al. | |
| 2003/0226258 A1* | 12/2003 | Patrick | B26B 19/382 30/34.05 |

(Continued)

FOREIGN PATENT DOCUMENTS

| | | |
|---|---|---|
| EP | 0436374 | 12/2009 |
| GB | 2323224 | 9/1998 |

OTHER PUBLICATIONS

PCT International Search Report with Written Opinion in corresponding international application PCT/US2017/037420 dated Sep. 11, 2017.

(Continued)

*Primary Examiner* — Jeff W Natalini
(74) *Attorney, Agent, or Firm* — John M. Lipchitz

(57) ABSTRACT

A personal consumer product having an energy emitting element in selective electrical communication with a power source is provided. Thermal control circuitry is used to isolate the energy emitting element from the power source when a temperature of the energy emitting element exceeds a threshold. A diagnostics routine is used to test the functionality of the hardware and software of the personal consumer product.

16 Claims, 12 Drawing Sheets

(56) References Cited

U.S. PATENT DOCUMENTS

| | | |
|---|---|---|
| 2006/0070242 A1 | 4/2006 | Szczepanowski et al. |
| 2006/0123631 A1 | 6/2006 | Szczepanowski et al. |
| 2011/0167640 A1* | 7/2011 | Flyash ............... B26B 21/48 30/34.05 |
| 2012/0205362 A1 | 8/2012 | Etzkorn et al. |
| 2012/0217982 A1* | 8/2012 | Narayanasamy .... H03K 17/962 324/686 |
| 2012/0255942 A1 | 10/2012 | Vodvarka |
| 2013/0146581 A1* | 6/2013 | Donarski ............... F24C 7/087 219/413 |
| 2014/0097850 A1* | 4/2014 | Law ................... H01H 1/0015 324/415 |
| 2014/0114301 A1 | 4/2014 | Solomon et al. |
| 2015/0068043 A1 | 3/2015 | Gester et al. |
| 2015/0122899 A1 | 5/2015 | Kaneko et al. |
| 2015/0197019 A1 | 7/2015 | Hodgson |
| 2015/0197021 A1 | 7/2015 | Hodgson et al. |
| 2016/0131713 A1* | 5/2016 | Edwards ............ G01R 31/3274 324/415 |

OTHER PUBLICATIONS

U.S. Appl. No. 15/189,289, filed Jun. 22, 2016, Klaus Heubach et al.

\* cited by examiner

PERSONAL CONSUMER PRODUCT WITH THERMAL CONTROL CIRCUITRY DIAGNOSTICS AND METHODS THEREOF

FIELD OF THE INVENTION

The present disclosure provides for a personal consumer product having an electrically driven energy emitting element.

BACKGROUND OF THE INVENTION

Products having electrically driven heating features are prevalent. Such products can be found in cars, homes, and offices. Many such heaters require that they quickly reach a requested or preset target temperature but do not significantly exceed the temperature. It is commonly expected that heating devices are safe, especially for personal consumer products.

Various methods are currently utilized in an attempt to achieve the requisite levels of safety and performance. For example, many kitchen appliances, such as kettles, cooking plates, irons, and coffee makers, use thermal fuses or circuit breakers. Due to their relatively large size, thermal fuses or circuit breakers are typically used in products of sufficient size to house these electrical components without detracting from the desired form factor of the product.

Another approach to increase the safety of a heating device is to use control circuitry for temperature regulation, with the control circuitry using an input from a temperature sensor. However, in case of a failure of the control circuit and/or the temperature sensor, the heating element may undesirably experience excessive heating. Yet another approach to increasing the safety of heating devices is to control the generated heat through the use of self-limiting heating elements that have a positive temperature characteristic, sometimes referred to as "PTCs," which increase in electrical resistance as temperature increases. Thus, a PTC is self-limiting at a certain temperature since, when driven by a constant voltage source (e.g., a battery), the temperature stabilizes at a certain value because the supplied power ($P=V^2/R$) decreases with the increasing temperature until it is in balance with the dissipated power. This technique can be used, for example, for a heated car mirror, certain hair stylers, and other household appliances. However, even though PTC-based devices are self-limiting, they can undesirably take a relatively long period of time to reach the steady state temperature, as providing power to the PTC element slows down as it comes closer to the steady state temperature.

Thus, it would be advantageous to provide for a product with heating features that addresses one or more of these issues. Indeed, it would be advantageous to provide for a personal consumer product that provides sufficient heating levels within a desired period of time while maintaining a desired form factor for its use. It would also be advantageous to provide a personal consumer product having circuitry that prevents overheating. It would further be advantageous to provide a diagnostics routine to test the operation of hardware and software of the personal consumer product.

SUMMARY OF THE INVENTION

The present disclosure fulfills the needs described above by, in one embodiment, a personal consumer product comprising a power source, a first control unit comprising a plurality of ports, and an energy emitting element in selective electrical communication with the power source. A plurality of sensors are positioned to sense a temperature of the energy emitting element. Each of the plurality of sensors are in electrical communication with a respective port of the first control unit. The personal consumer product further comprises a plurality of switching elements that are switchable between a conducting state and a non-conducting state to electrically isolate the energy emitting element from the power source. The first control unit is to execute a diagnostics routine that comprises one or more of testing the switching function of each of the plurality of switching elements between the conducting state and the non-conducting state and testing the temperature sensing function of each of the plurality of sensors.

BRIEF DESCRIPTION OF THE DRAWINGS

The above-mentioned and other features and advantages of the present disclosure, and the manner of attaining them, will become more apparent and the disclosure itself will be better understood by reference to the following description of nonlimiting embodiments of the disclosure taken in conjunction with the accompanying drawings, wherein.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DETAILED DESCRIPTION OF THE INVENTION

The present disclosure provides for personal consumer products having an energy emitting element controlled by one or more thermal control circuits. Various nonlimiting embodiments of the present disclosure will now be described to provide an overall understanding of the principles of the function, design and operation of the personal consumer products. One or more examples of these nonlimiting embodiments are illustrated in the accompanying drawings. Those of ordinary skill in the art will understand that the methods described herein and illustrated in the accompanying drawings are nonlimiting example embodiments and that the scope of the various nonlimiting embodiments of the present disclosure are defined solely by the claims. The features illustrated or described in connection with one nonlimiting embodiment may be combined with the features of other nonlimiting embodiments. Such modifications and variations are intended to be included within the scope of the present disclosure.

Figure 1:
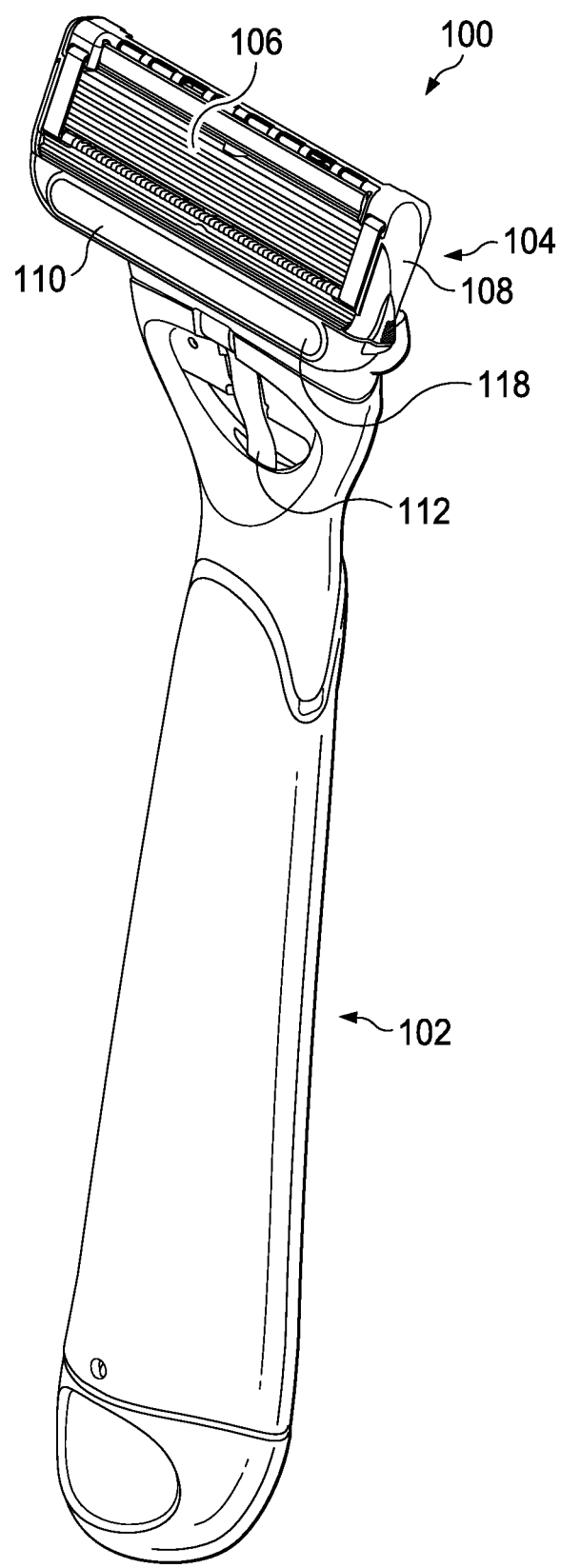
FIG. 1 depicts an exemplary personal consumer product having a heating element.

Referring now to FIG. 1, an exemplary personal consumer product 100 having a heating element is depicted in accordance with one nonlimiting embodiment of the present disclosure. While the personal consumer product 100 is depicted as a wet-shaving razor, such depiction is for illustrative purposes only. Other examples of personal consumer products may include, without limitation, epilators or other hair cutting and/or epilating household devices, toothbrushes, laser hair removal devices, and so forth. Further, while a heating element 110 is depicted, in other embodiments the personal consumer product may additionally, or alternatively, include other types of energy emitting elements. Example energy emitting elements may include light emitting diodes (LEDs), lasers, vibrating or oscillating components, and so forth.

In certain embodiments, the personal consumer product 100 may include a shaving razor cartridge 104 mounted to a handle 102. The shaving razor cartridge 104 may be fixedly or pivotably mounted to the handle 102 depending on the overall desired cost and performance. The shaving razor cartridge 104 may be permanently attached or removably mounted to the handle 102. The shaving razor cartridge 104 may have a housing 108 with one or more blades 106 mounted thereto. The handle 102 may hold a power source (not shown) that supplies power to the heating element 110. Many personal consumer products in accordance with the present disclosure may be battery driven, with some using a rechargeable battery that may be recharged while the personal consumer product is not in use.

The heating element 110 may comprise a metal, such as aluminum or steel. In certain embodiments, the heating element 110 may be a compound of a metallic skin plate and a ceramic bar which carries electrically conducting tracks, with sensors and connection terminals being part of a control circuit in order to electrically connect the heating element 110 to one or more thermal control circuits (i.e., a primary circuit and a redundant circuit) via a flexible conducting band 112. As described in more detail below, the one or more thermal control circuits may regulate current flow through the heating element 110 based on the detection of certain events, such as an excessive temperature event. The transformation of the electrical energy of a power source into thermal energy of the heating element 110 may be facilitated by a resistive layer printed on the surface of a ceramic substrate, such as using thick-film technology. The heating element 110 may comprise a skin contacting surface 118 that delivers heat to a consumer's skin during a shaving stroke for an improved shaving experience. The heating element 110 may be mounted to either the shaving razor cartridge 104 or to a portion of the handle 102. For embodiments alternatively or additionally utilizing a different type of energy emitting element, electrical energy of the power source may be transformed into thermal energy using other techniques, with such thermal energy being a byproduct of light generation or a byproduct of mechanical vibration, for example. In any event, the thermal control circuitry described herein may redundantly detect for excessive heat events and responsively isolate the energy emitting element from the power source to allow for the energy emitting element to cool.

Figure 2:
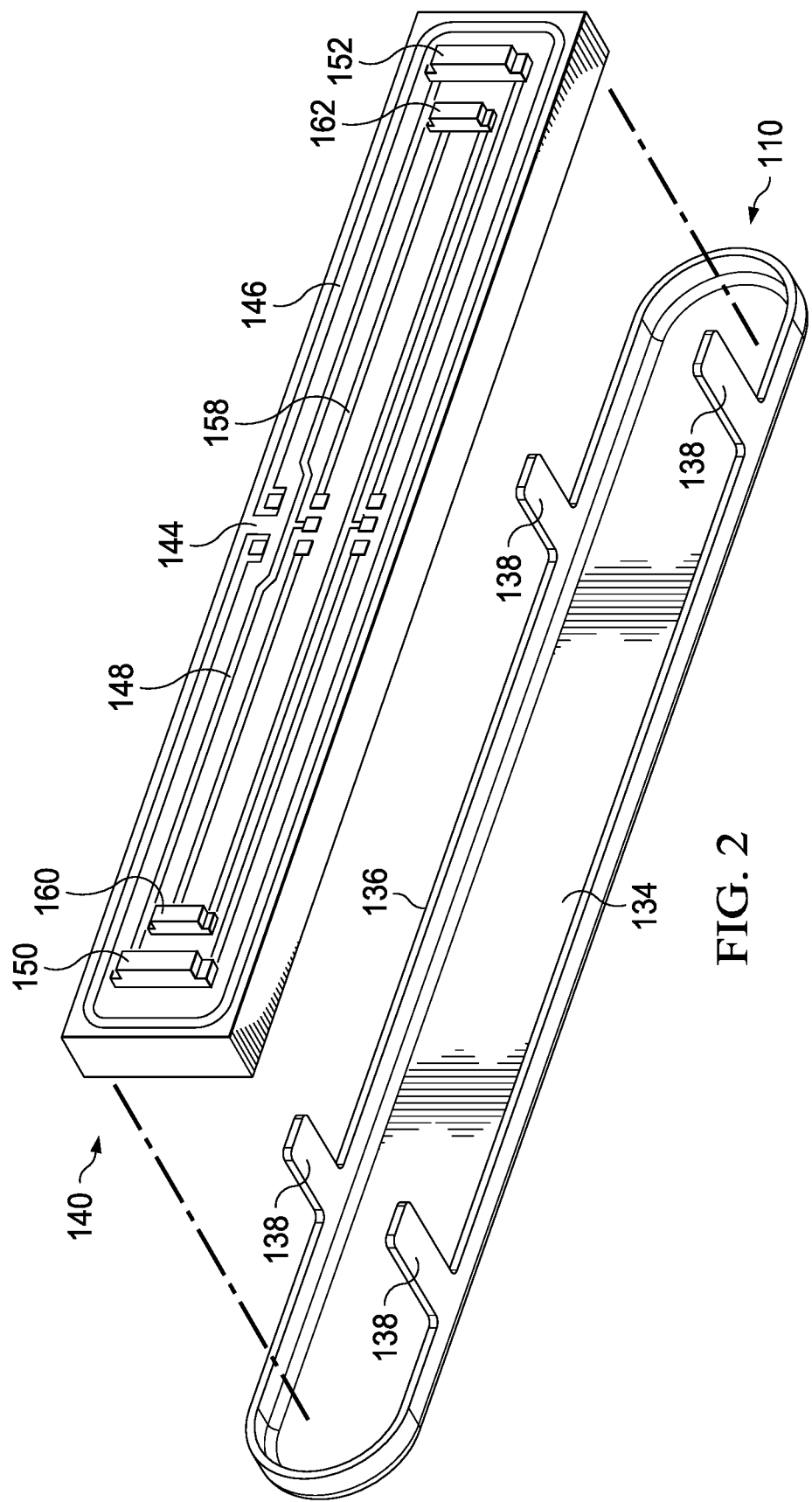
FIG. 2 depicts an exploded view of the heating element shown in FIG. 1.

Referring to FIG. 2, an exploded view of one possible embodiment of the heating element 110 depicted in FIG. 1 is shown. The heating element 110 may have a bottom surface 134 opposing the skin contacting surface 118 (FIG. 1). A perimeter wall 136 may define the bottom surface 134. One or more legs 138 may extend from the perimeter wall 136, transverse to and away from the bottom surface 134. For example, FIG. 2 illustrates four legs 138 extending from the perimeter wall 136. The legs 138 may facilitate locating and securing the heating element 110 during the assembly process. An insulating member 140 may be positioned within the perimeter wall 136. In certain embodiments, the insulating member 140 may comprise a ceramic or other material having high thermal conductivity and/or excellent electrical insulator properties. The insulating member 140 may have a first surface (not shown) that faces the bottom surface 134 of the heating element and a second surface 144 opposite the first surface. The perimeter wall 136 may help contain and locate the insulating member 140. In certain embodiments, the insulating member 140 may be secured to the bottom surface 134 by various bonding techniques generally known to those skilled in the art. It is understood that the perimeter wall 136 may be continuous or segmented (e.g., a plurality of legs or castellations).

The second surface 144 of the insulating member 140 may comprise a heating track 146 that extends around a perimeter of the insulating member 140. A first electrical circuit track 148 may also extend generally along a perimeter of the second surface 144. In certain embodiments, the first electrical circuit track 148 may be positioned inside of a boundary defined by the heating track 146. The first electrical circuit track 148 may be spaced apart from the heating track 146. The first electrical circuit track 148 may comprise a pair of thermal sensors 150 and 152 that are positioned on opposite lateral ends (e.g., on left and right sides) of the second surface 144 of the insulating member 140. In certain embodiments, the thermal sensors 150 and 152 may be NTC-type thermal sensors (negative temperature coefficient). The first electrical circuit track 148 and the thermal sensors 150 and 152 may be components of a first thermal control circuit serving to detect for excessive heating events of the first electrical circuit track 148.

The second surface 144 of the insulating member 140 may further comprise a second electrical circuit track 158 that may be spaced apart from the heating track 146 and the first electrical circuit track 148. The second electrical circuit track 158 may comprise a pair of thermal sensors 160 and 162 that are positioned on opposite lateral ends (e.g., on left and right sides) of the second surface 144 of the insulating member 140. In certain embodiments, the thermal sensors 160 and 162 may be NTC-type thermal sensors. The second electrical circuit track 158 and the thermal sensors 160 and 162 may be components of a second thermal control circuit serving to redundantly detect for excessive heating events. The thermal sensors 150 and 152 may independently output a signal related to the temperature of the heating element 110 to a first control unit and the thermal sensors 160 and 162 may independently output a signal related to the temperature of the heating element 110 to second control unit. The output signal may be in the form of the thermal sensor's electrical resistance that varies in relation to temperature.

While FIG. 2 depicts the use of four sensors 150, 152, 160, and 162 positioned at opposite lateral ends of the heating element 110, this disclosure is not so limited. For example, in certain embodiments, the first electrical circuit track 148 may include a single sensor and the second electrical circuit track 158 may include a single sensor, with each sensor positioned generally central to the second surface 144 of the insulating member 140. In such arrangements, the sensor of the second electrical circuit track 158 may be considered redundant to the sensor of the first electrical circuit track 148. In accordance with certain implementations, the sensors 150, 152, 160, and 162 are positioned at opposite lateral ends of the heating element 110 due to the limited thermal conductance along the heating element 110. Accordingly, a single sensor positioned in the middle of the heating element 110 would not necessarily provide temperature information at certain points along the heating element 110, such as at the lateral ends.

Figure 3:
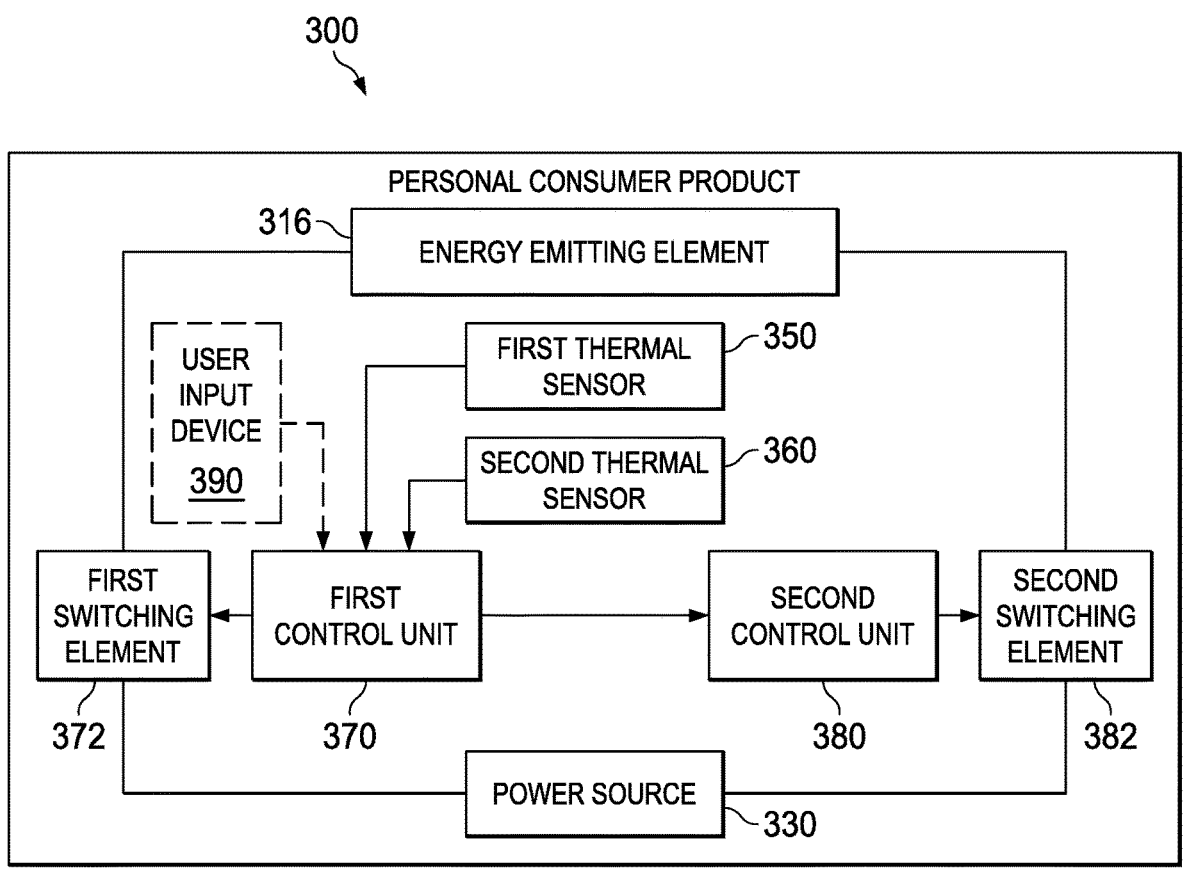
FIG. 3 is a block diagram depicting an example personal consumer product having an energy emitting element in selective electrical communication with a power source.

FIG. 3 is a block diagram depicting an example personal consumer product 300 having an energy emitting element 316 in selective electrical communication with a power source 330. In certain embodiments, such as for wet-shaving razors, the power source may be a battery which may deliver up to 6 Watts of power for the duration of a typical shave and which accommodates enough energy to allow for multiple shaves. One example power source is a rechargeable battery, such as a Lithium-Ion cell with a nominal voltage of 3.6 V and a capacity of 680 mAh. In such embodiments, the resistance of the energy emitting element 316 may be about 2.5 Ohms. Other types of personal consumer products may utilize different types of power sources and other types of energy emitting elements may have different resistance levels.

A first thermal sensor 350 is positioned to sense a temperature of the energy emitting element 316. The first thermal sensor 350 is in electrical communication with a first control unit 370. For wet-shaving razors, the first control unit 370 may be positioned within the handle 102 (FIG. 1) and connected to the first thermal sensor 350 via the flexible conducting band 112 (FIG. 1). A first switching element 372 is in electrical communication with the first control unit 370. The first thermal sensor 350, the first control unit 370, and the first switching element 372 may comprise a first thermal control circuit which serves to monitor the sensed temperature of the energy emitting element 316 and detect overheating events. The first switching element 372 may be switchable by the first control unit 370 between a conducting state and a non-conducting state (i.e., a closed state to an open state). When the first switching element 372 is in the non-conductive state, the energy emitting element 316 is electrically isolated from the power source 330 such that current is not delivered to the energy emitting element 316, or the current supply is otherwise decreased. The first switching element 372 is switched by the first control unit 370 to the non-conducting state when a first sensed temperature of the energy emitting element 316 exceeds a first thermal threshold. Depending on the operation of the first control unit 370 and the first switching element 372, various control techniques may be utilized which serve to reduce the temperature of the energy emitting element 316. For example, in some embodiments, the switching function of the first switching element 372 between the conductive and non-conductive state utilizes a pulse width modulation (PWM) control scheme. In some embodiments, when the first thermal threshold is exceeded, the first switching element 372 is switched to a non-conductive state for a predetermined period of time before being switched to a conductive state. Thus, when an overheating event is detected (i.e., the first thermal threshold is exceeded), the power being delivered to the energy emitting element 316 is reduced to allow the energy emitting element 316 to cool.

The first thermal threshold may be set or selected using any of a variety of techniques. In certain embodiments, the first thermal threshold is preset for the personal consumer product 300 during manufacturing, such that it is not adjustable. In other embodiments, the first thermal threshold may be user-adjusted. For instance, a user may interact with a user input device 390 to select one of a plurality of thermal thresholds, or otherwise adjust the thermal threshold for the first control unit 370. The user input device 390 may vary, but in some embodiments the user input device 390 comprises an interactive element, such as a button, a dial, a switch, a keypad, a slider, or the like to allow a user to interact with the first control unit 370. In this regard, the user may be presented with a grouping of presets (i.e., such as "low and high", or "low, medium, and high") or the user may be able to incrementally adjust the first thermal threshold between a minimum temperature value and a maximum temperature value.

A second thermal sensor 360 is positioned to also sense a temperature of the energy emitting element 316. In the illustrated embodiment, the second thermal sensor 360 is in electrical communication with the first control unit 370, which is configured to provide signaling to a second control unit 380. In other embodiments, the second thermal sensor 360 may be in direct electrical communication with the second control unit 380. For instance, the second control unit 380 may comprise one or more voltage comparators that are configured to control a second switching element 382 based on the output of the second thermal sensor 360. In such configurations, the second control unit 380 may be independent from, and redundant to, the first control unit 370.

For wet-shaving razors, the second control unit 380 may be positioned within the handle 102 (FIG. 1) and connected to the second thermal sensor 360 via the flexible conducting band 112 (FIG. 1). The second switching element 382 may be switchable by the second control unit 380 between a conducting state and a non-conducting state based on signals received by the second control unit 380 from the first control unit 370. The second thermal sensor 360, the second control unit 380, and the second switching element 382 may comprise a second thermal control circuit which, similar to the first thermal control circuit, serves to monitor the sensed temperature of the energy emitting element 316 for overheating events. Upon receiving the signal from the first control unit 370, the second control unit 380 may hold the second switching element 382 in a conductive state for a predetermined period of time. Thus, the second control unit 380 may function as a retriggerable timer that holds the second switching element 382 in a closed position for the predetermined period of time once it receives an actuation signal from the first control unit 370. During that period of time, assuming the first switching element 372 is also conductive, the energy emitting element 316 will remain in electrical communication with the power source 330. If the second control unit 380 does not receive a signal from the first control unit 370 during the predetermined period of time, the second control unit 380 will transition the second switching element 382 to a non-conductive state (i.e., open the switch), thereby electrically isolating the energy emitting element 316 from the power source 330 and allowing the energy emitting element 316 to cool.

The second thermal control circuit may generally be redundant to, or a back-up of, the first thermal control circuit, such that, should a component of either the first thermal control circuit or the second thermal control circuit fail to operate, the other of the first thermal control circuit or the second thermal control circuit continues to monitor for excessive heat events and takes action should an excessive heat event occur. The first thermal threshold and the second thermal threshold may be independently set. In some embodiments, the thermal thresholds are set at substantially the same temperature, whereas, in other embodiments, one is set at a level higher than the other. For embodiments utilizing the user input device 390 and having a preset maximum temperature value for the first thermal threshold, the second thermal threshold may be set to be higher than the maximum temperature value.

Figure 4:
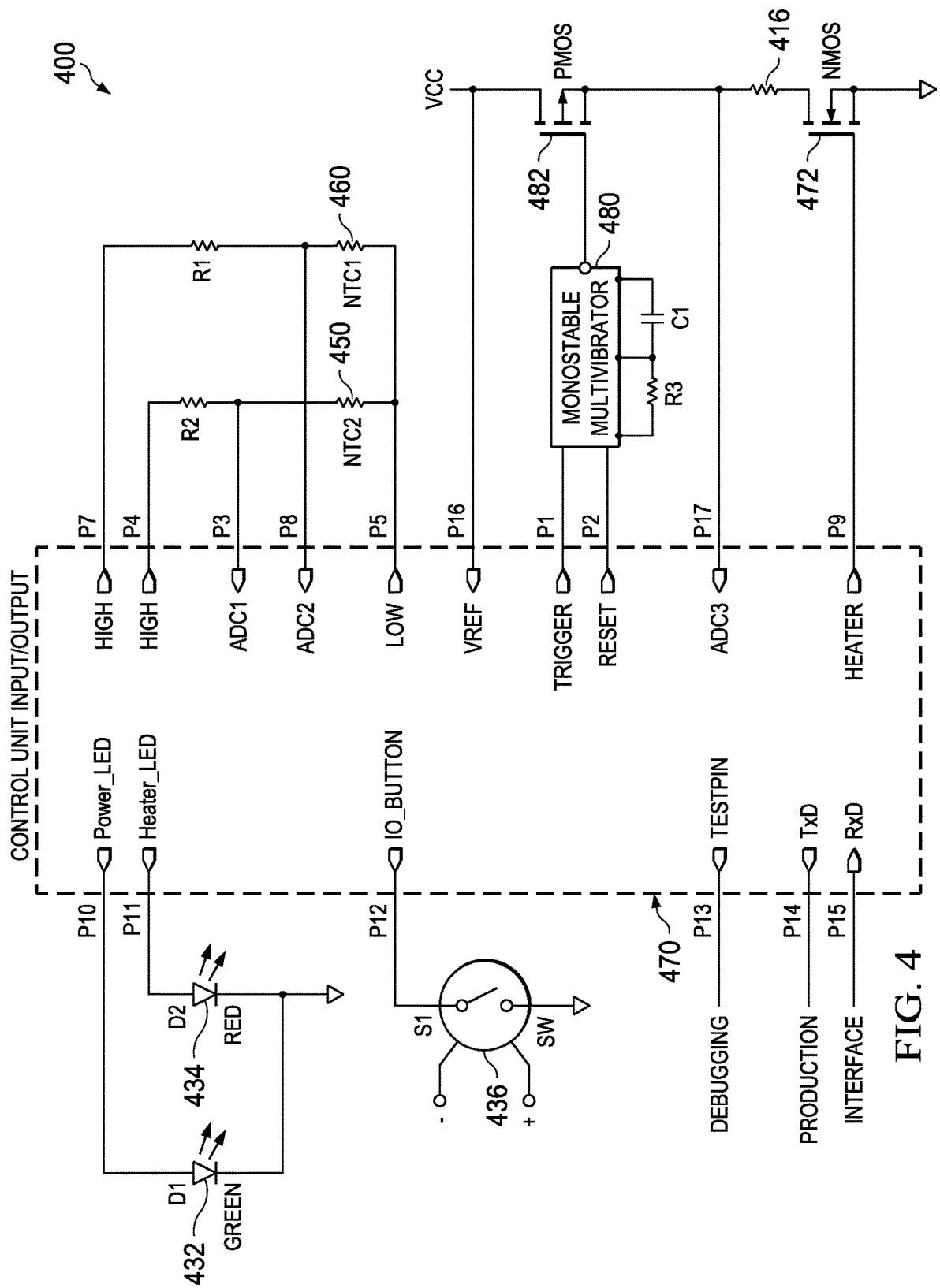
FIG. 4 is a circuit schematic for an example personal consumer product.

FIG. 4 shows a circuit schematic 400 for another example personal consumer product, which is similar to the block diagram shown in FIG. 3. As depicted, multiple thermal sensors and multiple switching elements are used to provide redundancy, but the control unit is not redundant. More specifically, a second thermal sensor 460 is redundant to a first thermal sensor 450 and a second switching element 482 is redundant to a first switching element 472. The first thermal sensor 450, which changes its resistance based on sensed temperature, in combination with the precision resistor R2, supplies a voltage to a measuring port P3 of a first control unit 470 that is representative of the sensed temperature, with the precision resistor R2 converting the resistance change into a voltage change that may be processed by the first control unit 470. The first control unit 470 may selectively switch the first switching element 472 between a conductive and non-conductive state via an actuation port P9 depending on whether a threshold temperature has been reached or not as determined by the voltage at measuring port P3. Through this thermal control circuit, an energy emitting element 416 may generally be held at a constant temperature. In addition to this temperature control function, the first control unit 470 may also manage other operations of the personal consumer product, such as illuminating LEDs 432 and 434, and monitoring the position of a power switch 436, among other operations.

In the illustrated circuit schematic 400, a monostable multivibrator 480 (sometimes called a one-shot multivibrator) serves as a second control unit that is used to control the operational state of the second switching element 482. Due to operationally different software processes in the first control unit 470 that control the respective first switching element 472 and the second switching element 482, certain process redundancy may be achieved, as a failure of one process may not directly lead to a failure of the other process. The monostable multivibrator 480 receives a control signal (i.e., a trigger) from the actuation port P1 of the first control unit 470. The monostable multivibrator 480 generates an output that is used to control the second switching element 482, which is a p-MOSFET transistor in the illustrated configuration. When the output signal of the monostable multivibrator 480 is low, the second switching element 482 is closed (i.e., in a conductive state) allowing current to flow through the energy emitting element 416. The output of the monostable multivibrator 480 is switched on for a defined time period after receiving an input signal on the input of the monostable multivibrator 480. This input signal is periodically provided by the first control unit 470 via the actuation port P1. The duration of the output signal of the monostable multivibrator 480 is defined by a timing circuit comprising a resistor R3 and a capacitor C1. The duration of the output signal of the monostable multivibrator 480 may be slightly longer than the period of the trigger signal created by the actuation port P1 of the first control unit 470. Thus, as long as the first control unit 470 properly functions and creates the trigger signal with the desired frequency, the output of the monostable multivibrator 480 remains low to maintain the second switching element 482 in a conductive state. If the first control unit 470 fails to create the trigger signal in time (i.e., in response to an increased voltage input at port P8 provided by the second thermal sensor 460 and precision resistor R1, or due to any other process or function, such as when a process of the first control unit 470 hangs), the monostable multivibrator 480 will provide an output that will switch the second switching element 482 to an open (i.e., non-conductive) state to isolate the energy emitting element 416 from the power source.

The safe operating state of a personal consumer product utilizing circuit schematic 400, or other suitable control circuitry, which has an energy emitting element 416 may be achieved by switching off the energy emitting element 416. Generally, the minimum of time needed to reach a critical or other threshold temperature at full heating power specifies the maximum response time of onboard security/diagnostic measures. Software supported hardware diagnostics tests are described below that seek to detect abnormal operating conditions by self-monitoring and plausibility tests in an effort to prevent undesirable operating conditions. The diagnostics tests described herein may be performed cyclically and on a time-critical basis. As such, any issues may be detected prior to the energy emitting element 416 reaching a critical temperature. Generally, signals are generated by the first control unit 470, and analog values obtained by ADC return measurements of the first control unit 470 are compared with expected values. If a measured value is outside a defined area, operation of the personal consumer product may be suspended, or other actions may be taken. In order to avoid an undesirable operating condition during the testing process, the test sequence may be selected such that any previous test ensures the conditions of the subsequent test.

In order to perform the personal consumer product diagnostics described herein, and as shown by the circuit schematic 400, the circuitry of the personal consumer product may have certain characteristics. The first thermal sensor 450 and the second thermal sensor 460 may be connected to measuring ports of the first control unit 470, shown as ports P3 and P8, respectively. At least one of the first switching element 472 or the second switching element 482 is connected in series with the energy emitting element 416 between a supply voltage and ground (GND). One of the first or second switching elements 472, 482 is arranged between the energy emitting element 416 and the supply voltage and ground, and a measuring port is connected to the energy emitting element 416 circuit between the energy emitting element 416 and this current switching element (arranged between the energy emitting element 416 and the high or low supply voltage), shown as port P17. The measuring ports of the first control unit 470 comprise analog to digital converter (ADC) ports for measuring the voltage at measuring points in the circuit schematic 400, the first thermal sensor 450, and/or the second thermal sensor 460. The first control unit 470 may be adapted to perform diagnostic measurements at various ADC ports for testing the switching function of the first and second switching elements 472, 482, for testing the plausibility of temperature measurements of the first and second thermal sensors 450, 460, and/or for testing the integrity of the circuitry depending on switching states of the first and second switching elements 472, 482. Further, the ADC-ports of the first control unit 470 (i.e., analog port or analog input) may be adapted to convert an analog voltage (and/or current) applied to the port into a digital value. The respective analog-digital-converter (ADC) might be integrated into the first control unit 470 (as illustrated) or provided by a separate electronic component connected to a port of the first control unit 470. The ADC-ports and/or other ports of the first control unit 470 might be pulled up to the control unit high voltage (in the following also referred to as HIGH) or pulled down to the control unit low voltage (in the following also referred to as LOW) via an internal (weak) pull-up or pull-down resistor by software program code installed on the first control unit 470 in an executable manner to perform, for instance, diagnostic measurements (also referred to as a weak pull-up port or weak pull-down port). While the diagnostic routines described herein apply to the circuitry depicted in FIG. 4, it is to be appreciated that other diagnostic routines may be performed on other types of circuitry that may be utilized in other personal consumer products without departing from the scope of the present disclosure.

Also, further measurement ports or other ports may be provided at the first control unit 470 for switching on and off a signal, such as a high or low control unit voltage, or a trigger signal for triggering the monostable multivibrator 480 to function as a "dead man's switch." The control unit high or low voltage (HIGH, LOW) may be used for performing the measurements with the provided sensor elements. In some configurations, a measuring port might be software-configurable as ADC-port (analog-port or analog input), ground-port (digital output or push-pull-stage with LOW level) for supplying the control unit low voltage LOW, voltage-port (digital output or push-pull-stage with HIGH level) for supplying the control unit high voltage HIGH, weak pull-up port, and/or weak pull-down port. This approach may allow for flexible adaption of the control unit ports during diagnostic measurements and more flexible diagnostic measurements, thereby enhancing information on the integrity of the circuit (including switching and/or temperature measurement function and/or components). Generally, these configurable ports of the control unit may also be referred to as general-purpose input/output (GPIO) ports. The control unit ports may also comprise switching ports (digital input/output) for switching the first and second switching elements 472, 482.

In accordance with the present disclosure, by using different diagnostic measurements certain tests of the circuit and circuit components may be performed for testing the circuit and/or components independently from their normal function. Such diagnostic measurements may be performed periodically and/or upon certain detectable events, such as switching on and/or off the personal consumer product. In order to provide high redundancy and enhanced diagnostic measurement possibilities, at least one of the first and second switching elements 472, 482 may be connected in the heater circuit in series with the energy emitting element 416 such that the other of the first and second switching elements 472, 482 switching elements is arranged between the energy emitting element 416 and GND. For circuitry having more than two switching elements, all switching elements may be connected in series with the energy emitting element 416 and each other. According to some configurations, one measuring port of the control unit is connected to the circuit between each of the current switching elements. With such an arrangement, the switching function of each switching element may be tested by diagnostic measurements, as described in more detail below.

A measuring port of the first control unit 470 may be connected to a measuring point in the circuitry between the energy emitting element 416 and the first or second switching elements 472, 482 that is connected between the energy emitting element 416 and the high supply voltage (HIGH). For performing one possible type of diagnostic measurements, the first control unit 470 may be adapted to open each of the first and second switching elements 472, 482. In this state, no current is flowing to the energy emitting element 416. Then, the first control unit 470 may perform a voltage measurement at the measuring point and compare the measurement result with at least one expected value, as described in detail below. It may be particularly useful, if the measuring ADC-ports connected to the circuit are internally pulled up or down for these measurements in order to detect unwanted open circuits. For configurations having further measurement points between two switches disposed in series in the circuit, all or a useful selection of measurement points might be evaluated before the measurement point between the energy emitting element 416 and the switching element arranged between the energy emitting element 416 and high supply voltage VCC is evaluated.

In some configurations, as an alternative and/or consecutive diagnostic step, the first control unit 470 may be adapted to close one of the first or second switching elements 472, 482 after the other, such as by starting with the first or second switching elements 472, 482 connected to low supply voltage GND, to measure the voltage at the measuring point between the energy emitting element 416 and the switching elements connected to the high supply voltage and/or other measuring points in the energy emitting element 416 circuit. The measurement result may be compared with at least one expected value, as described in detail below.

According to one configuration, when closing the last of the first or second switching elements 472, 482 (or other switching element) connected in series with the energy emitting element 416, the last of the first or second switching elements 472, 482 (or other switching element) is opened after a short measurement period as current is flowing through the energy emitting element 416, and the energy emitting element 416 is heated. By limiting the measurement period and, upon expiration of the period, reopening the last of the first or second switching elements 472, 482 (or other switching element), overheating of the energy emitting element 416 may be prevented. The short measurement period may be defined, for example, based on a temperature threshold of the energy emitting element 416 which is not to be exceeded. This temperature threshold may be determined by measurement through the first and second thermal sensors 450, 460 or may be determined theoretically based on a calculated or measured current and the known heating effect in the energy emitting element 416. Nevertheless, even within a relatively short measurement period it is possible to compare the measurement results with at least one expected value, as described in detail below.

In configurations using the monostable multivibrator 480, the monostable multivibrator 480 may be tested by applying a trigger pulse to the monostable multivibrator 480. Such test may be performed subsequent to testing the first or second switching elements 472, 482. Thus, when applying the trigger pulse, a current is flowing through the energy emitting element 416 and then stopping when a subsequent trigger pulse is not applied during the test. The energy emitting element 416 and the dead man's function of the monostable multivibrator 480 may be tested together.

Diagnostic measurements in accordance with the present disclosure may be realized in a software-based manner by the first control unit 470 identifying a defective behavior of the components of the circuit and, in particular, of the sub-circuits containing the energy emitting element 416, of the first and second switching elements 472, 482, and of the first and second thermal sensors 450, 460. To this aim, signals are software-generated by the first control unit 470 and the resulting analog values are measured by its ADC-ports (e.g., P3, P7, and P17). The measured values are compared with one or more expected values or value ranges. If one failure is detected (i.e., a measured value is out of the expected value range) the energy emitting element 416 can be switched off as a precautionary measure (e.g. by switching off one or both of the first or second switching elements 472, 482.) When multiple diagnostic tests are run in sequence, the order may be selected such that previous diagnostic measurements secure the safety conditions for the subsequent tests. Generally it might be advantageous to perform measurements regarding the function of the current switching elements and in subsequent steps, perform measurements regarding the function of the thermal sensors.

An example of advantageous order of diagnostic measurements is presented with regard to FIGS. 5-18. One skilled in the art is to appreciate that the order and content of the proposed diagnostic measurements may be altered to adapt the measurements to certain specific requirements of an embodiment without departing from the scope of the present disclosure. Further, certain of the described measurements might be omitted or other types of measurements may be used.

Still referring to FIG. 4, the ports of the first control unit 470 are shown with additional information, such as an arrow and a label. An arrow directed into the inside of the first control unit 470 describes an input-port and an arrow directed towards the outside of the first control unit 470 describes an output-port. The descriptions in the ports indicate the port functions as follows:

"HIGH": output of control unit high voltage HIGH, e.g. by connecting the port to the high supply voltage VCC. The high voltage signal is not necessarily equal to the high supply voltage VCC as defined by the power supply, but might be high voltage signal down to about 90% of the high supply voltage VCC, for example;

"HIGH-Z": port isolated from any potential (i.e. makes port pin electrically floating with connection to any potential);

"ADC": analog-digital-converter input for voltage measurement;

"LOW": output of microprocessor low voltage LOW, e.g. by connecting the port to the GND. The low voltage signal is not necessarily equal to 0 Volt as defined by the power supply, but might be low voltage signal up to about 10% of the high supply voltage VCC, for example;

"VRef": input of precise reference voltage, e.g. high supply voltage VCC;

"Trigger": output of periodical trigger signal;

"Reset": output of reset signal for retriggerable monoflop element, the second switching element 482 is open (switched off) if reset signal is active; and "Heater": output for switching off and on the first switching element 472, which may control a heater or other energy emitting element.

An ADC-port pulled up to the supply voltage (VCC) via a high-impedance internal (weak) pull-up resistor R4 (FIG. 5) is indicated to be the supply voltage (VCC) connected through the internal weak pull-up resistor R4 inside the first control unit 470.

In FIGS. 5-18 example diagnostic measurements for example diagnostic routines are described, with relevant portions of the circuit schematic 400 being shown. The content and order of the measurement is merely a preferred example for an example set of diagnostic measurements. However, the order and scope of the diagnostic measurements may be changed without departing from the scope of the present disclosure. Generally, the diagnostic measurements described herein are used to detect or test for any one or more of the following: electrical shorts cause by humidity or bad soldering points, different alternatives of the circuitry, failures at different locations in the circuitry, as well as further aspects described in the following examples. With regard to the diagnostic measurements schematically depicted in FIGS. 5-18, bold lines in the circuit diagram indicate the tested region of the circuit. A bold line passing through a switching element indicates that the respective switch is closed. A flash shown near a component schematically indicates the test is identifying whether the component has an electrical short.

Figure 5:
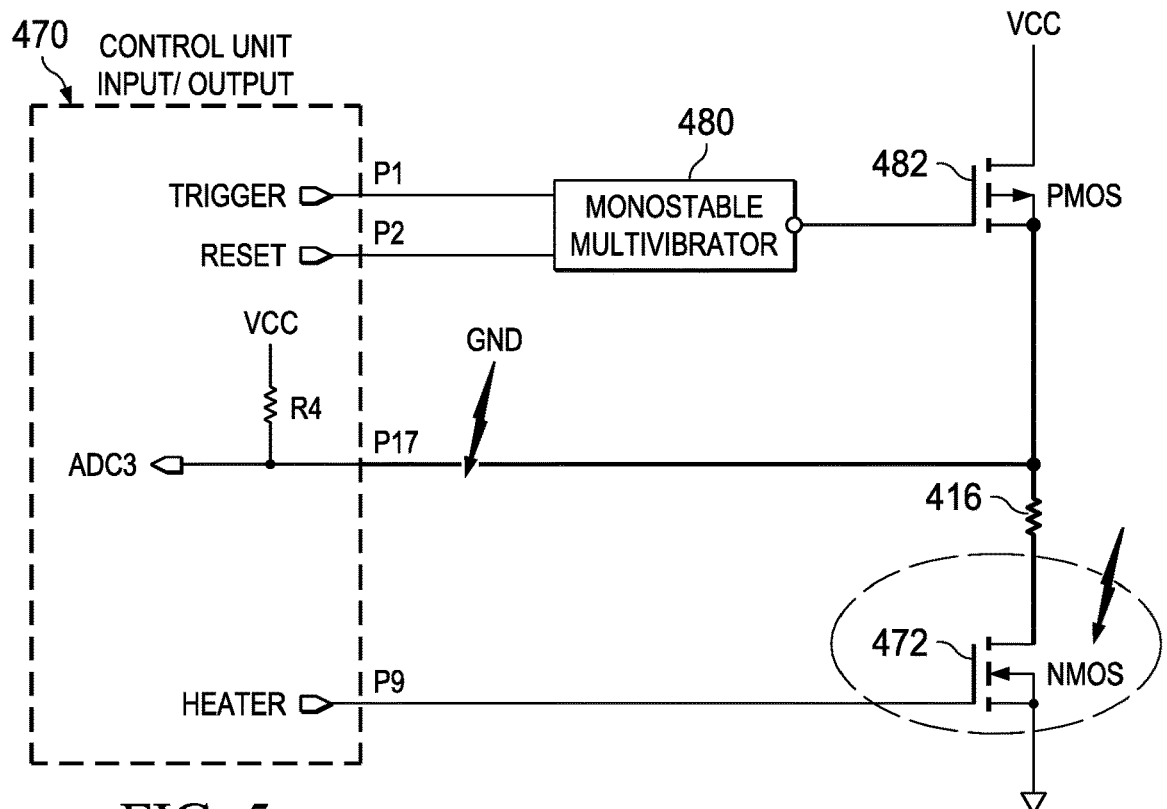
FIG. 5 is a portion of the circuit schematic of FIG. 4 schematically depicting a test for the isolation of the first switching element and for the absence of an electrical short between a port and ground.

Referring now to FIG. 5, the energy emitting element 416 is isolated against ground (GND). ADC-port P17 should collect a high signal corresponding to the supply voltage VCC applied via the internal (weak) pull-up resistor R4. This is a test for the isolation of the first switching element 472 (e.g. NMOS-transistors) and for absence of an electrical short between ADC-port P17 and GND.

Figure 6:
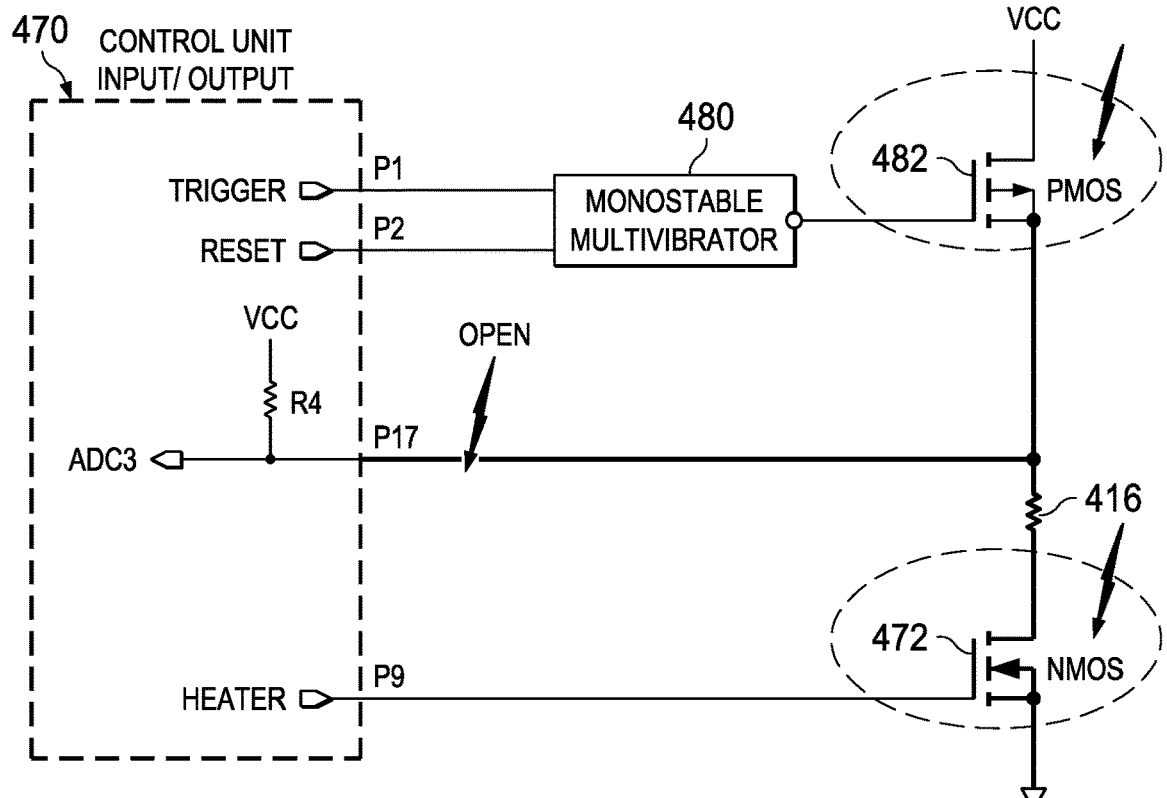
FIG. 6 is a portion of the circuit schematic of FIG. 4 schematically depicting a test for the isolation of a second switching element and for connection of a first switching element and a port to the circuitry.

Referring now to FIG. 6, the energy emitting element 416 is connected to GND. ADC-port P17 should collect a low signal corresponding to GND. This is a test for the isolation of the second switching element 482 and for connection of the first switching element 472 and ADC-port P17 to the circuitry.

Figure 7:
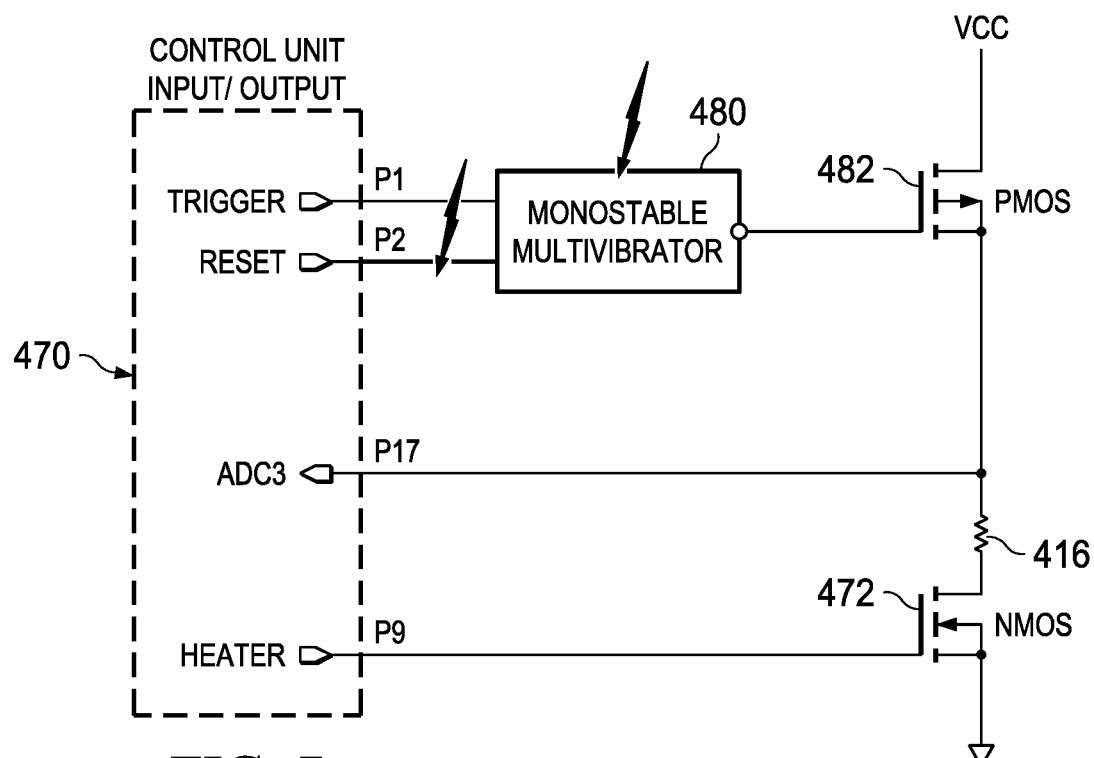
FIGS. 7-8 are portions of the circuit schematic of FIG. 4 schematically depicting testing of a monostable multivibrator.

Referring now to FIG. 7, an example test is illustrated for circuitry that has a monostable multivibrator 480. The first switching element 472 is in the conductive state. An active reset signal on port P2, as indicated by the bold line in FIG. 7, should cause the monostable multivibrator 480 to immediately open the second switching element 482, even if a trigger signal is applied through port P1. ADC-port P17 collects a low signal corresponding to GND. If a higher signal is collected at ADC-port 17, a failure of the monostable multivibrator 480 is indicated. During this test, the connection of port P2 to the monostable multivibrator 480 and the reset signal of the safety circuit are tested.

Figure 8:
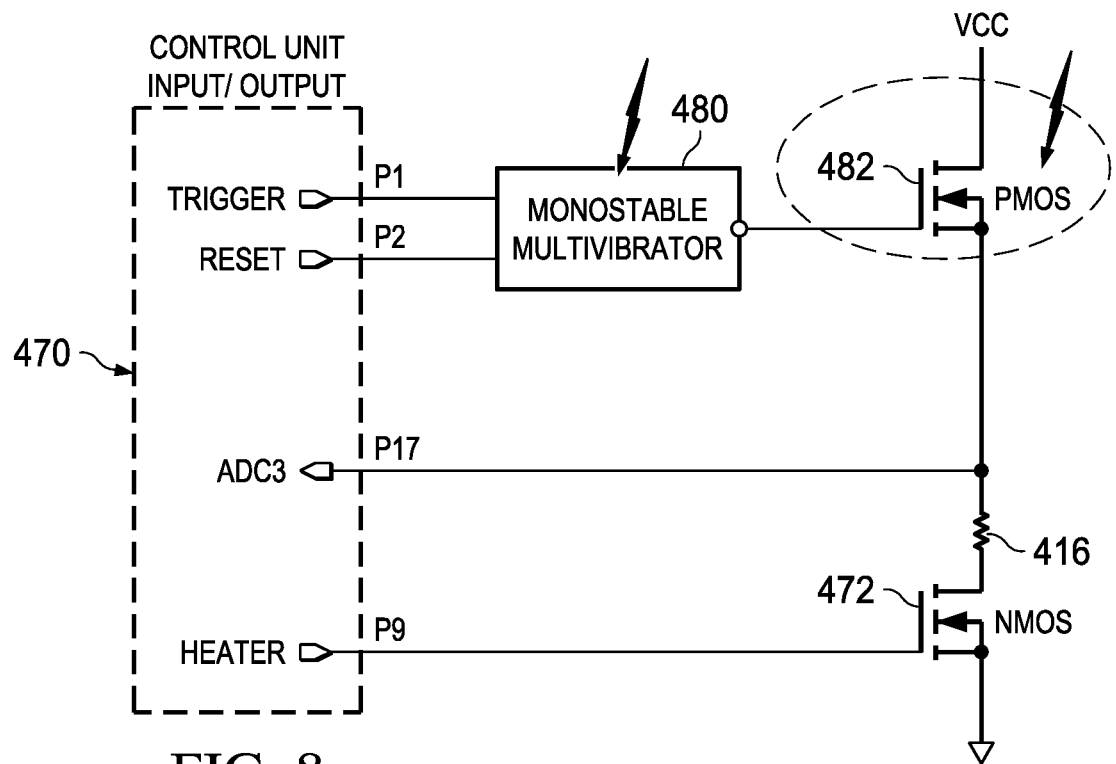

Referring now to FIG. 8, with an inactive reset signal on port P2 and the first switching element 472 in a conductive state, ADC-port P17 should collect a high signal corresponding to VCC for a certain amount of time determined by the time constant of the monostable multivibrator 480 after the application of the trigger signal. After a predefined time has elapse, a low signal corresponding to GND should be detected. This is a test for a connection of the second switching element 482 and energy emitting element 416 for the time constant of the monostable multivibrator 480, the current flowing through the energy emitting element 416, and the functional operation of the first switching element 472.

Figure 9:
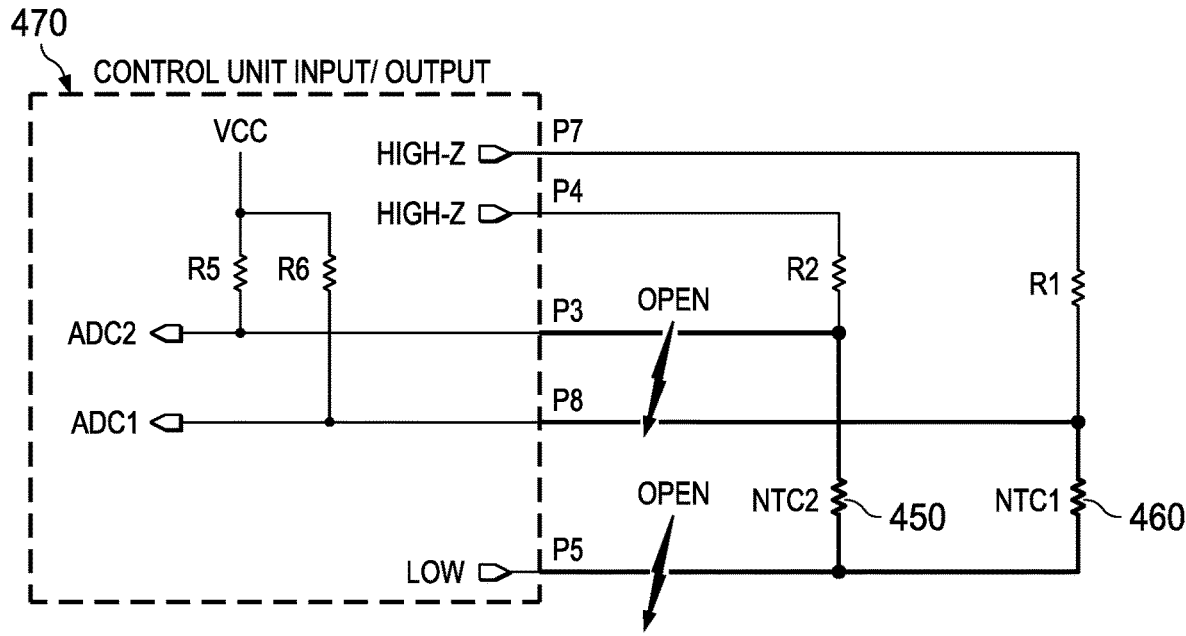
FIG. 9 is a portion of the circuit schematic of FIG. 4 schematically depicting testing for a connection of a first thermal sensor and a second thermal sensor to a control unit and the correct resistance of the first thermal sensor and the second thermal sensor at operational conditions.

Referring now to FIG. 9, ADC-ports P3 and P8 should collect a signal value corresponding to the voltage divider consisting of the internal (weak) pull-up resistors R5 and R6 and the first thermal sensor 450 and the second thermal sensor 460, respectively. This is a test for connection of the first thermal sensor 450 and the second thermal sensor 460 to port P5 (GND) and ADC-ports P3 and P8, respectively, and the correct resistance of the first thermal sensor 450 and the second thermal sensor 460 (e.g. NTC elements) at operational conditions (e.g. ambient temperature). During this test, the first switching element 472 is open and the second switching element 482 is open.

Figure 10:
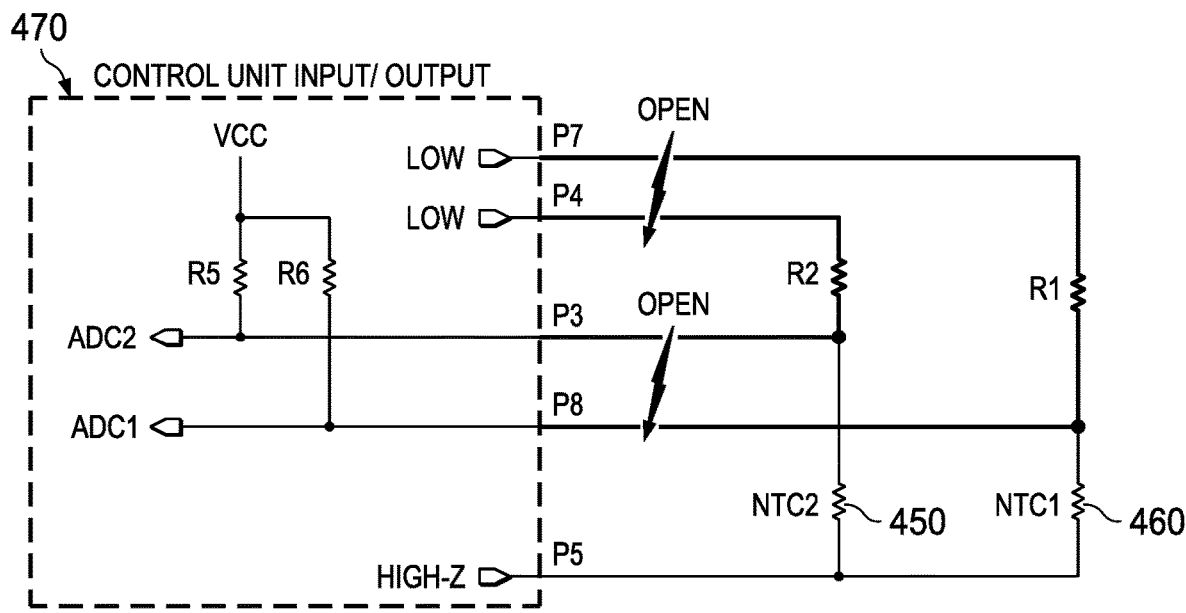
FIG. 10 is a portion of the circuit schematic of FIG. 4 schematically depicting a test for connection of the measurement circuitry.

Referring now to FIG. 10, ADC-ports P3 and P8 should collect a signal value corresponding to the voltage divider consisting of the internal (weak) pull-up resistors R5 and R6 and the half-bridge resistors R2 and R1, respectively. This is a test for connection of the measurement circuitry, such as the half-bridge resistors R2 and R1. During this test, the first switching element 472 is open and the second switching element 482 is open.

Figure 11:
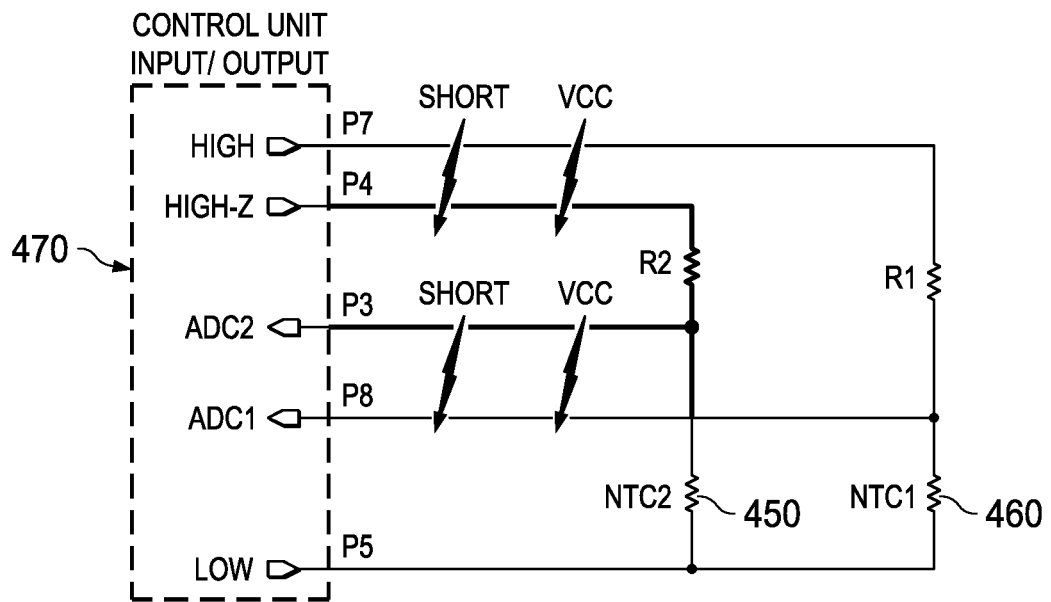
FIG. 11 is a portion of the circuit schematic of FIG. 4 schematically depicting a test for an absence of electrical shorts between various ports and between a port and a high supply voltage VCC as well as testing for a plausible temperature measurement of a second thermal sensor.

Referring now to FIG. 11, the second thermal sensor 460 is shown functioning in a measuring mode. ADC-port P8 should collect a signal value corresponding to the actual temperature. ADC-port P3 should collect a low signal corresponding to the control unit low voltage LOW. This is a test for absence of electrical shorts between ADC-port P3 and P8 as well as between port P3 and high supply voltage VCC. This test also checks for plausible temperature measurement of the second thermal sensor 460. During this test, the first switching element 472 is open and the second switching element 482 is closed.

Figure 12:
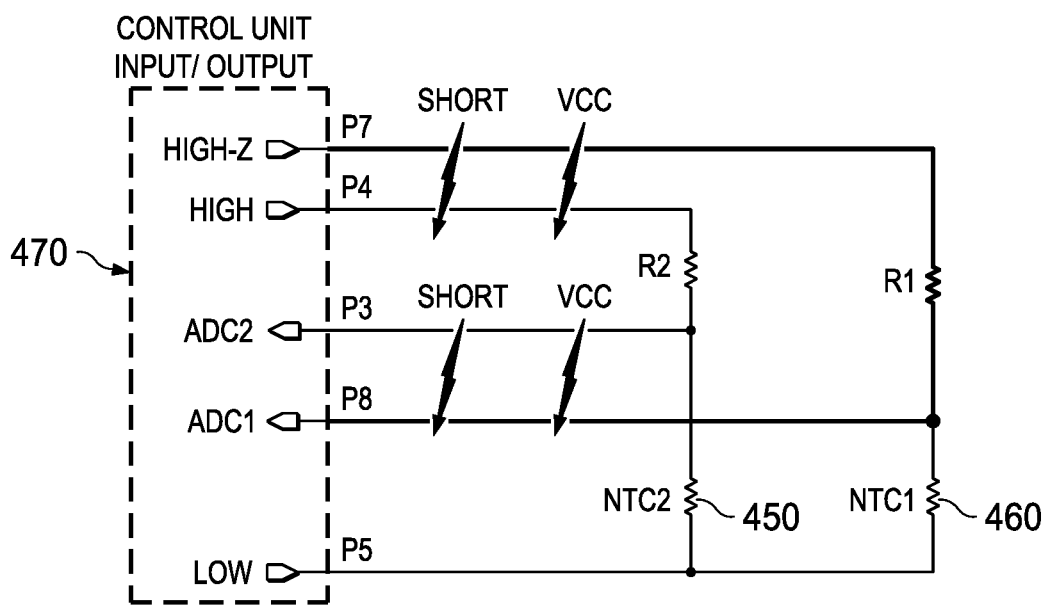
FIG. 12 is a portion of the circuit schematic of FIG. 4 schematically depicting a test for an absence of electrical shorts between various ports and between a port and a high supply voltage VCC as well as for plausible temperature measurement of a first thermal sensor.

Referring now to FIG. 12, the depicted test is similar to the test depicted in FIG. 11, except it is directed to testing the functionality of the first thermal sensor 450. The first thermal sensor 450 is functioning in a measuring mode. ADC-port P3 should collect a signal value corresponding to the actual temperature. ADC-port P8 should collect a low signal corresponding to the control unit low voltage LOW. This is a test for absence of electrical shorts between ADC-port P3 and P8 as well as port P8 and high supply voltage VCC. This test also checks for plausible temperature measurement of the first thermal sensor 450. The temperature measurements in port P8 during this test and in port P8 during the test depicted in FIG. 11 should correspond to each other if the measurements are performed one after the other. This correspondence also indicates adequate thermal coupling of both thermal sensors 450 and 460 to each other. During this test, the first switching element 472 is open and the second switching element 482 is closed.

Figure 13:
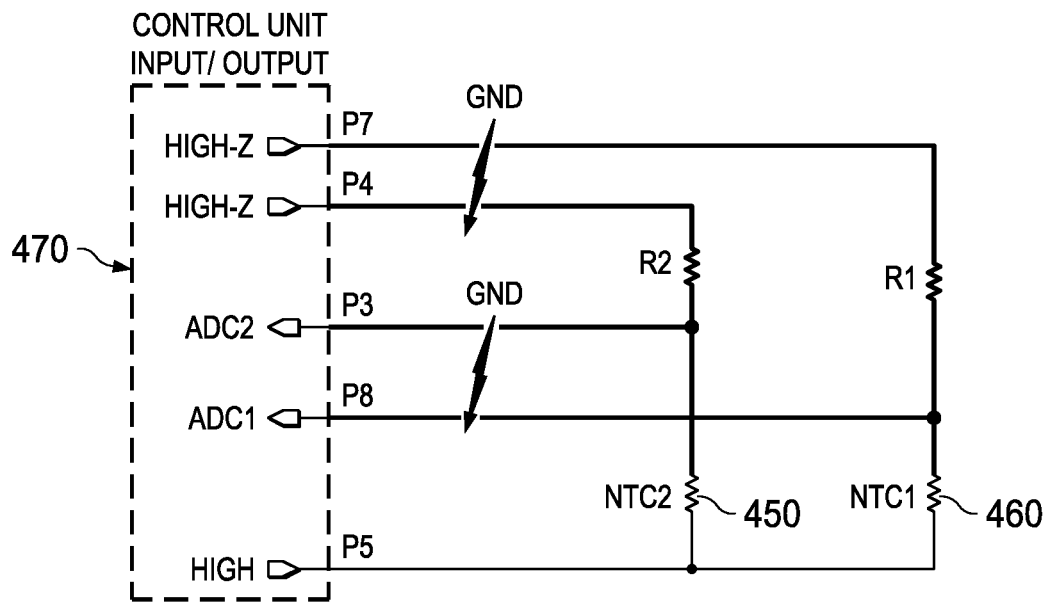
FIG. 13 is a portion of the circuit schematic of FIG. 4 schematically depicting a test for an absence of any electrical shorts to ground in the circuitry between various ports.

Referring now to FIG. 13, during this test ADC-ports P3 and P8 should collect high signal values corresponding to the control unit high voltage HIGH. This is a test for absence of any electrical shorts to ground in the circuitry between ports P7 and P8 or P4 and P3, respectively. During this test, the first switching element 472 is closed and the second switching element 482 is open.

Figure 14:
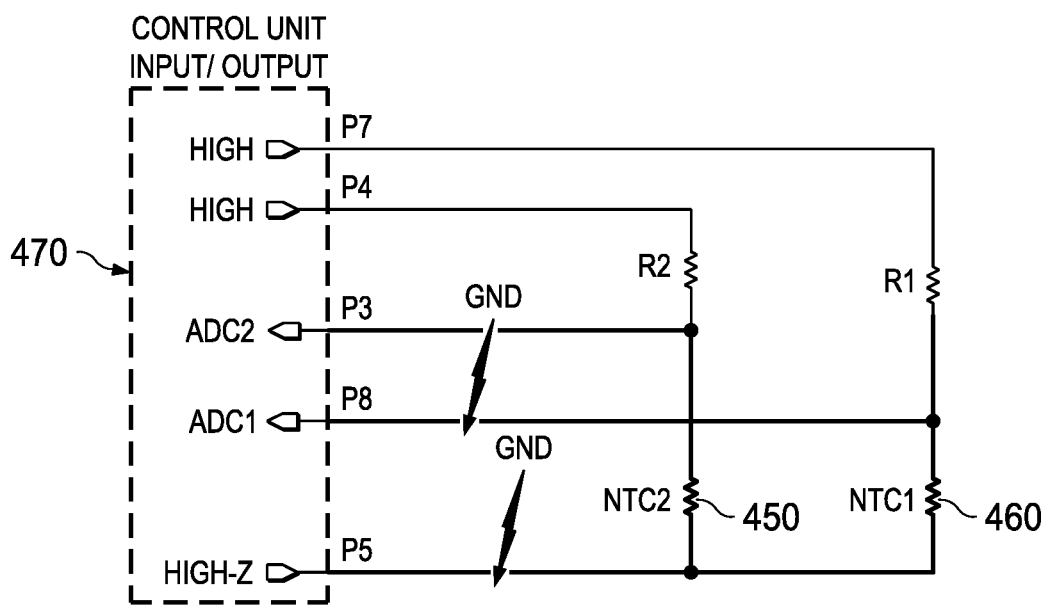
FIG. 14 is a portion of the circuit schematic of FIG. 4 schematically depicting a test for an absence of any electrical shorts to ground in the circuitry between ports P8 and P5 or P3 and P5, respectively.

Referring now to FIG. 14, ADC-ports P3 and P8 should collect high signal values corresponding to the microprocessor high voltage HIGH. This is a test for absence of any electrical shorts to ground in the circuitry between ports P8 and P5 or P3 and P5, respectively. During this test, the first switching element 472 is closed and the second switching element 482 is open.

Figure 15:
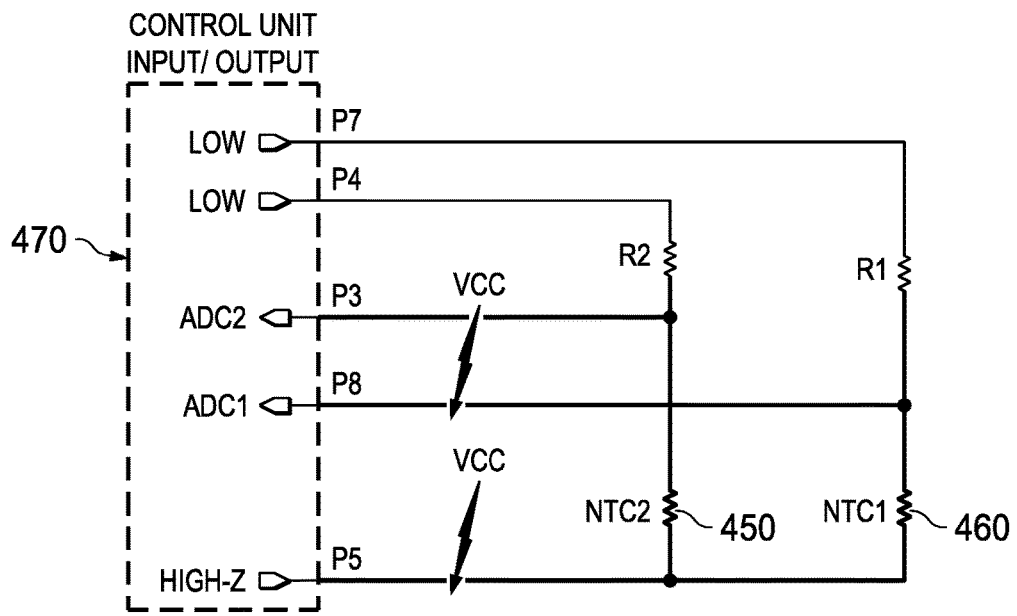
FIG. 15 is a portion of the circuit schematic of FIG. 4 schematically depicting a test for an absence of any electrical shorts to the high supply voltage between various ports.

Referring now to FIG. 15, ADC-ports P3 and P8 should collect low signal values corresponding to the microcontroller low voltage LOW. This is a test for absence of any electrical shorts to the high supply voltage VCC in the circuitry between ports P8 and P5 or P3 and P5, respectively. During this test, the first switching element 472 is open and the second switching element 482 is closed.

Figure 16:
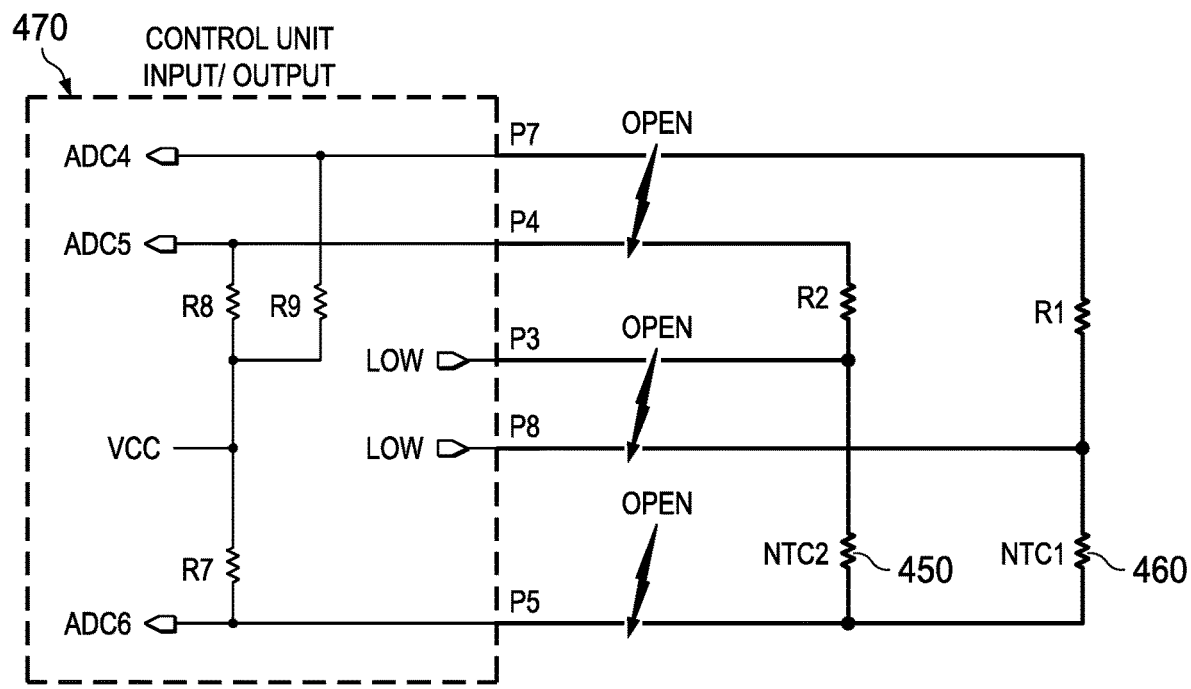
FIGS. 16-18 depict example alternatives to the tests depicted in FIGS. 9-15.
Figure 17:
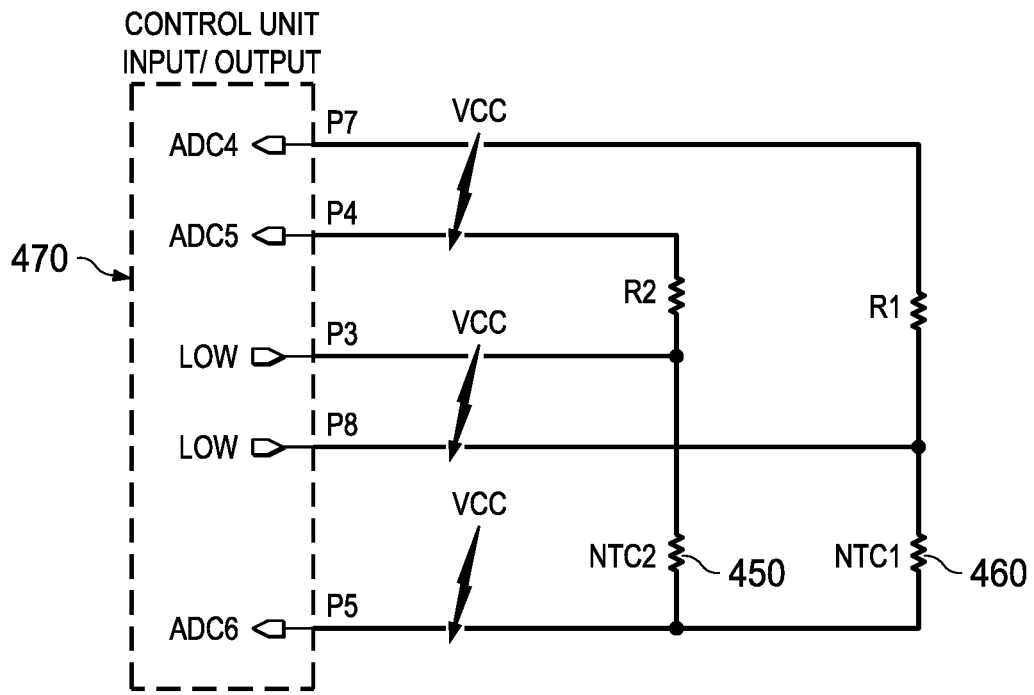
Figure 18:
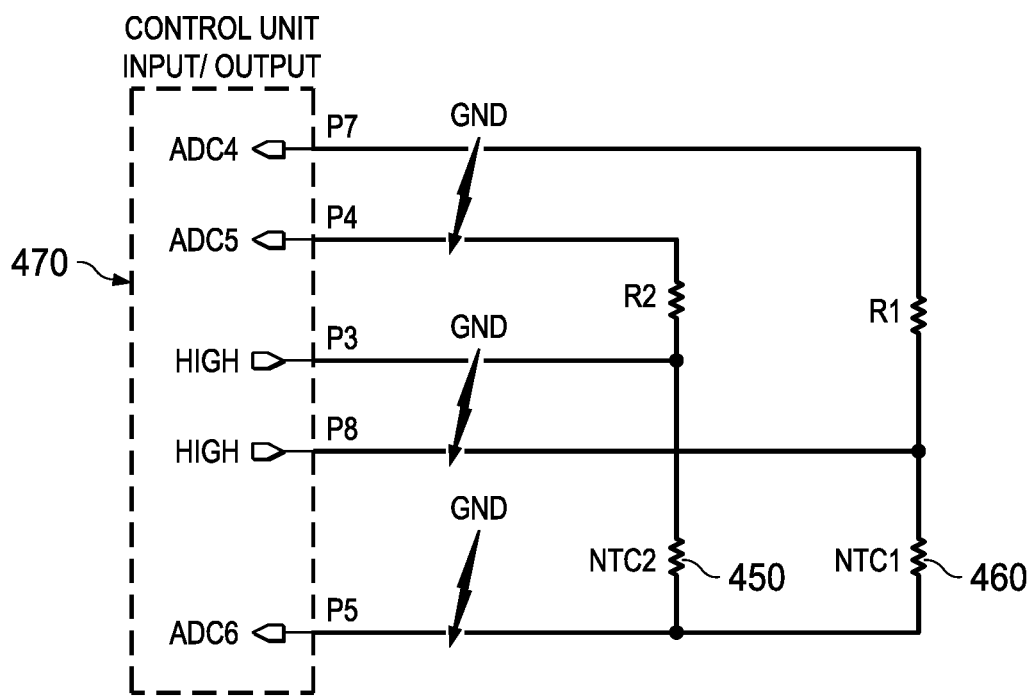

Referring now to FIGS. 16-18, example alternatives to the tests depicted in FIGS. 9-15 are depicted. As such, the information collected during the test is similar (i.e., regarding absence of any electrical shorts and connectivity) and fewer measurements are utilized. However, additional software configuration of the control ports may be necessary.

With regard to FIG. 16, the software configured ADC-ports P7, P4 and P5 should collect a signal value corresponding to the voltage divider consisting of the internal (weak) pull-up resistors R7, R8, R9 and the first thermal sensor 450 and the second thermal sensor 460 or half-bridge resistors R2, R1, respectively. The collected values should be in a predefined range (of values), corresponding to the ratios of R2/R8, R1/R9, NTC1/R7 and NTC2/R7 and should not exceed a respective threshold. During this test, the first switching element 472 is open and the second switching element 482 is open.

Referring now to FIG. 17, the software configured ADC-ports P7, P4 and P5 should collect a low signal value corresponding to the control unit low voltage LOW. This is a test for absence of any electrical shorts to the high supply voltage VCC (delivered to the energy emitting element 416 by closing second switching element 482) for all connections in the temperature measurement circuitry shown in FIG. 17. During this test, the first switching element 472 is open and the second switching element 482 is closed.

Referring now to FIG. 18, the software configured ADC-ports P7, P4 and P5 should collect a high signal value corresponding to the supply voltage VCC. This is a test for absence of any electrical shorts to ground (connected to the energy emitting element 416 by closing the first switching element 472) for all connections in the temperature measurement circuitry shown in FIG. 18. During this test, the first switching element 472 is closed and the second switching element 482 is open.

Figure 19:
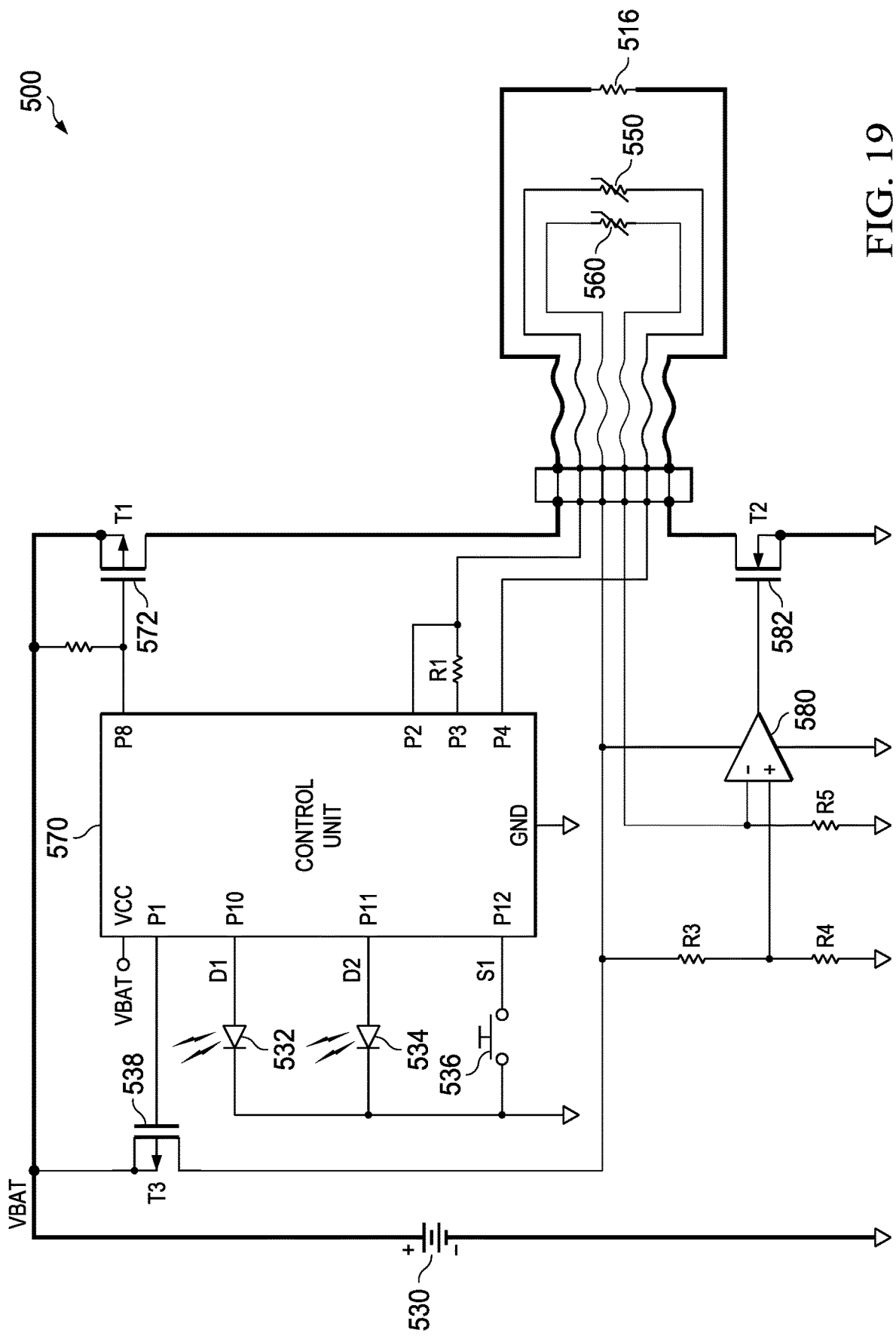
FIG. 19 is a circuit schematic of another example personal consumer product.

While FIGS. 4-18 schematically depict circuitry 400 of a personal consumer product that includes a monostable multivibrator 480, it is to be appreciated that diagnostic tests similar to those presented above may be used for other personal consumer product circuits that have different componentry. For instance, instead of utilizing a monostable multivibrator 480, some personal consumer products may utilize one or more voltage comparators as a second thermal control unit, as illustrated in FIG. 19, below. Through the use of the software cyclical testing described above, various types of errors may be detected that do not necessarily lead directly to a dangerous condition, but identify potential issues with the redundant fault control circuitry. In addition, obvious errors and inherent errors may be detected during the testing cycle, such as Microcontroller Stuck-at faults, ADC hardware failure, heater failure, battery failure, and the like.

Referring now to FIG. 19, a circuit schematic 500 for an example personal consumer product, such as a wet-shaving razor, is shown. The circuit schematic 500 includes a first (i.e., primary) thermal control circuit and a second (i.e., redundant) thermal control circuit. An energy emitting element 516 is in selective electrical communication with a power source 530 through each of a first switching element 572, shown as p-MOSFET transistor T1, and a second switching element 582, shown as n-MOSFET transistor T2. The first switching element 572 is controlled by a first control unit 570 and the second switching element 582 is controlled by a second control unit, shown as a voltage comparator 580. Since the first switching element 572, the energy emitting element 516, and the second switching element 582 are in a series arrangement, if either of the first switching element 572 or the second switching element 582 is placed into a non-conductive state then the energy emitting element 516 is electrically isolated from the power source 530.

A first thermal sensor 550 and second thermal sensor 560 are each positioned proximate to the energy emitting element 516 and are each a component of the first thermal control circuit and the second thermal control circuit, respectively. The first thermal sensor 550 feeds an input to a measuring port P2 of the first control unit 570 that is representative of the sensed temperature, as the first thermal sensor 550 changes resistance with temperature. A precision resistor R1 is used to convert this resistance change into a voltage change which may be processed by first control unit 570 to monitor for excess heating events.

The first control unit 570 may selectively switch the first switching element 572 between the conductive and non-conductive states via an actuation port P8 depending on whether a threshold temperature has been reached or not, based on the input voltage at port P2. Through this thermal control circuit, the energy emitting element 516 may generally be held at a constant temperature. In addition to this temperature control function, the first control unit 570 may also manage other operations of the personal consumer product, such as by illuminating LEDs 532 and 534, monitoring the position of a power switch 536, and controlling a power supply switch 538 (shown as MOSFET transistor T3) that provides power to the redundant thermal control circuity, for example. When the power switch 536 is depressed, the first control unit 570 switches the power supply switch 538 to a conductive state by drawing port P1 to ground, which provides power to the second thermal circuit (i.e., the voltage comparator 580). Should the first control unit 570 errantly leave the power supply switch 538 in the "off" position, the second switching element 582 will also be off and therefore prohibit current from flowing through the energy emitting element 516. Further, even if the power supply switch 538 is partly on, such as working in the linear mode with a higher drain-to-source resistance, the second thermal circuit will work properly, as the voltage difference between the inverting and non-inventing inputs (as described in more detail below) do not depend on the supply voltage.

The second thermal sensor 560 feeds a signal to the second control unit, shown as a voltage comparator 580, which is representative of the sensed temperature, as the second thermal sensor 560 changes resistance with temperature. Resistors R3 and R4 are arranged in a voltage divider and selected to place an input voltage at the non-inverting input (+) of the voltage comparator that defines a temperature threshold. The second thermal sensor 560 and resistor R5 are also arranged as a voltage divider to provide an input voltage to the inverting input (−) of the voltage comparator 580 that corresponds to the sensor temperature. As the temperature of the energy emitting element 516 rises, but is still beneath the temperature threshold, the voltage presented to the inverting input (−) of the voltage comparator 580 is lower than the voltage at the non-inverting (+) input of the voltage comparator 580. Accordingly, the output voltage of the voltage comparator 580 is substantially equal to the VBAT voltage level, which sets the second switching element 582 in a conducting state so that current can flow through the energy emitting element 516, assuming that the first switching element 572 is also in a conductive state. When the temperature increases to sufficiently raise the temperature of the second thermal sensor 560 above the temperature threshold, the output of the voltage comparator 580 will change from high to low due to the lowered resistance of the second thermal sensor 560, which causes the second switching element 582 to open. The heating element 516 will then be isolated from the power source 530 allowing it to cool. The second thermal sensor 560 will also cool and increase its resistance. Once its resistance has reached a certain level, the output of voltage comparator 580 will change from low to high, which causes the closing of the second switching element 582 and places the heating element 516 back into electrical communication with the power source 530.

Proper function of the heating element 516 can be tested or monitored by measuring the voltage of the power source 530 (i.e., the battery voltage). For instance, when the heating element 516 is activated, a detectable drop in the voltage of the power source 530 is caused due to the internal resistance of the power source 530. Accordingly, diagnostic routines can be employed to test various components of the circuit without the need to of additional hardware. Example diagnostic routines are described below.

First, the first switching element 572 can be tested for a short circuit. During this test, the first switching element 572 is opened and power supply switch 538 is closed. While in this state, the control unit 570 determines if the voltage of the power source 530 is constant, as is expected if the first switching element 572 is operating properly. If the first switching element 572 has a short circuit, a voltage drop will be detected that indicates to the control unit 570 that first switching element 572 is not properly operating. Next, the second switching element 582 can be tested for a short circuit. During this test, the first switching element 572 is closed and power supply switch 538 is opened. While in this state, the control unit 570 determines if the voltage of the power source 530 is constant, as is expected if the second switching element 582 is operating properly. If the second switching element 582 has a short circuit, a voltage drop will be detected that indicates to the control unit 570 that second switching element 582 is not properly operating.

The functionality of the voltage comparator 580 can also be tested. During this test, the power supply switch 538 is closed and the first switching element 572 is closed. While in this state, the control unit 570 checks for a drop in voltage of the power source 530 (i.e., due to the voltage comparator 580 causing the second switching element 582 to close) and later a rise in voltage after the desired temperature is reached (i.e., due to the voltage comparator 580 causing the second switching element 582 to open). The first and second thermal sensors 550, 560 can also be verified to be within tolerance by checking the resistance of the first and second thermal sensors 550, 560 at the point in time when the desired temperature is reached.

EXAMPLES

A. A personal consumer product, comprising:
  a. a power source;
  b. a first control unit comprising a plurality of ports;
  c. an energy emitting element in selective electrical communication with the power source;
  d. a plurality of sensors positioned to sense a temperature of the energy emitting element, each of the plurality of sensors in electrical communication with a respective port of the first control unit;
  e. a plurality of switching elements, each of the switching elements switchable between a conducting state and a non-conducting state to electrically isolate the energy emitting element from the power source;
  f. wherein the first control unit is to execute a diagnostics routine, the diagnostics routine comprising one or more of:
    i. testing the switching function of each of the plurality of switching elements between the conducting state and the non-conducting state; and
    ii. testing the temperature sensing function of each of the plurality of sensors.

B. The personal consumer product according to Paragraph A, wherein testing the switching function of each of the plurality of switching elements between the conducting state and the non-conducting state and testing the temperature sensing function of each of the plurality of sensors comprises measuring at least one voltage level at one of the plurality of ports.

C. The personal consumer product according to any of Paragraphs A-B, wherein testing the switching function of each of the plurality of switching elements between the conducting state and the non-conducting state and testing the temperature sensing function of each of the plurality of sensors comprises pulling at least one of the plurality of ports to a control unit high voltage and measuring a voltage at another of the at least one of the plurality of ports.

D. The personal consumer product according to any of Paragraphs A-C, wherein testing the switching function of each of the plurality of switching elements between the conducting state and the non-conducting state and testing the temperature sensing function of each of the plurality of sensors comprises pulling at least one of the plurality of ports to a control unit low voltage and measuring a voltage at another of the at least one of the plurality of ports.

E. The personal consumer product according to any of Paragraphs A-D, wherein testing the switching function of each of the plurality of switching elements between the conducting state and the non-conducting state and testing the temperature sensing function of each of the plurality of sensors comprises the at least one measured voltage to an expected voltage level.

F. The personal consumer product according to any of Paragraphs A-E, further comprising a second control unit, wherein the second control unit is to switch at least one of the plurality of switching elements between a conducting state and a non-conducting state.

G. The personal consumer product according to Paragraph F, wherein the second control unit is a monostable multivibrator.

H. The personal consumer product according to Paragraph F, wherein the diagnostics routine comprises applying a trigger pulse to the monostable multivibrator.

I. The personal consumer product according to Paragraph G, wherein the second control unit is a voltage comparator.

J. The personal consumer product according to any of Paragraphs A-E, wherein the energy emitting element is a heating element that heats to a threshold temperature over a period of time when in selective electrical communication with the power source.

K. The personal consumer product according to Paragraph J, wherein the diagnostics routine concludes prior to the conclusion of the period of time.

L. The personal consumer product according to any of Paragraphs A-K, wherein the energy emitting element is any of a light emitting diode, a heating element, and a laser element.

M. The personal consumer product according to any of Paragraphs A-L, wherein testing the switching function of each of the plurality of switching elements between the conducting state and the non-conducting state and testing the temperature sensing function of each of the plurality of sensors comprises at least one of:
  i. switching of each of the plurality of switching elements to a conducting state;
  ii. switching each of the plurality of switching elements to a non-conducting state; and
  iii. switching a first subset of the plurality of switching elements to a conducting state and switching a second subset of the plurality of switching elements to a non-conducting state.

N. The personal consumer product according to any of Paragraphs A-M, further comprising a first thermal control circuit and a second thermal control circuit, wherein the first thermal control circuit comprises at least one of the plurality of switching elements and at least one of the plurality of sensors and the second thermal control circuit comprises at least a different one of the plurality of switching elements and at least a different one of the plurality of sensors.

O. The personal consumer product according to Paragraph N, wherein the diagnostics routine sequentially tests the operation of the first thermal control circuit and the operation of the second thermal control circuit.

P. The personal consumer product according to any of Paragraphs A-O, wherein subsequent to the execution of diagnostics routine, the first control unit is to determine whether the energy emitting element is to be in selective electrical communication with the power source based on the results of the diagnostics routine.

Q. The personal consumer product according to any of Paragraphs A-P, wherein the diagnostic routine is to confirm an absence of electrical shorts to a circuit ground.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A personal consumer product, comprising:
    a power source;
    a first control unit comprising a plurality of measurement ports, wherein one or more of the plurality of measurement ports comprises an analog-digital-converter (ADC) input;
    a heating element that heats to a threshold temperature over a period of time in response to the switching element providing a conductive state between the heating element and the power source;
    a plurality of sensors positioned to sense a temperature of the heating element, each of the plurality of sensors in electrical communication with a respective measurement port of the first control unit;
    a plurality of switching elements, each of the switching elements switchable between a conducting state and a non-conducting state to electrically isolate the heating element from the power source;
    wherein the first control unit is configured to execute a diagnostics routine that concludes prior to the conclusion of the period of time, wherein the diagnostics routine comprises:
        a test of the switching function of each of the plurality of switching elements between the conducting state and the non-conducting state; and
        a test of the temperature sensing function of each of the plurality of sensors.

2. The personal consumer product of claim 1, wherein the test of the switching function of each of the plurality of switching elements between the conducting state and the non-conducting state and the test of the temperature sensing function of each of the plurality of sensors each comprise measuring at least one voltage level at one of the plurality of measurement ports.

3. The personal consumer product of claim 2, wherein the test of the switching function of each of the plurality of switching elements between the conducting state and the non-conducting state and the test of the temperature sensing function of each of the plurality of sensors each comprise pulling at least one of the plurality of measurement ports to a control unit high voltage and measuring a voltage at another of the at least one of the plurality of measurement ports.

4. The personal consumer product of claim 2, wherein the test of the switching function of each of the plurality of switching elements between the conducting state and the non-conducting state and the test of the temperature sensing function of each of the plurality of sensors each comprise pulling at least one of the plurality of measurement ports to a control unit low voltage and measuring a voltage at another of the at least one of the plurality of measurement ports.

5. The personal consumer product of claim 2, wherein the test of the switching function of each of the plurality of switching elements between the conducting state and the non-conducting state and the test of the temperature sensing function of each of the plurality of sensors each comprise a comparison of the at least one measured voltage to an expected voltage level.

6. The personal consumer product of claim 1, further comprising a second control unit, wherein the second control unit is to switch at least one of the plurality of switching elements between a conducting state and a non-conducting state.

7. The personal consumer product of claim 6, wherein the second control unit is a monostable multivibrator.

8. The personal consumer product of claim 7, wherein the diagnostics routine comprises an application of a trigger pulse to the monostable multivibrator.

9. The personal consumer product of claim 6, wherein the second control unit is a voltage comparator.

10. The personal consumer product of claim 1, wherein the test of the switching function of each of the plurality of switching elements between the conducting state and the non-conducting state and wherein the test of the temperature sensing function of each of the plurality of sensors each comprise at least one of:
    switching of each of the plurality of switching elements to a conducting state;
    switching each of the plurality of switching elements to a non-conducting state; and
    switching a first subset of the plurality of switching elements to a conducting state and switching a second subset of the plurality of switching elements to a non-conducting state.

11. The personal consumer product of claim 1, further comprising a first thermal control circuit and a second thermal control circuit, wherein the first thermal control circuit comprises at least one of the plurality of switching elements and at least one of the plurality of sensors and the second thermal control circuit comprises at least a different one of the plurality of switching elements and at least a different one of the plurality of sensors.

12. The personal consumer product of claim 11, wherein the diagnostics routine comprises sequentially testing the operation of the first thermal control circuit and the operation of the second thermal control circuit.

13. The personal consumer product of claim 11, wherein subsequent to the execution of diagnostics routine, the first control unit is configured to determine whether the heating element is to be in selective electrical communication with the power source based on the results of the diagnostics routine.

14. The personal consumer product of claim 1, wherein the diagnostic routine is configured to confirm an absence of electrical shorts to a circuit ground.

15. A personal consumer product, comprising:
   a power source;
   a first control unit comprising a plurality of ports, wherein the plurality of ports comprises at least one measurement port;
   a heating element in selective electrical communication with the power source, wherein the heating element heats to a threshold temperature over a period of time in response to the switching element providing a conductive state between the heating element and the power source;
   a plurality of sensors positioned to sense a temperature of the heating element, each of the plurality of sensors in electrical communication with a respective port of the first control unit;
   a plurality of switching elements, each of the switching elements switchable between a conducting state and a non-conducting state to electrically isolate the heating element from the power source;
   wherein the first control unit is configured to execute a diagnostics routine, wherein the diagnostics routine concludes prior to the conclusion of the period of time, and wherein the diagnostics routine comprises:
      a test of the switching function of each of the plurality of switching elements between the conducting state and the non-conducting state; and
      a test of the temperature sensing function of each of the plurality of sensors.

16. The personal consumer product of claim 15, further comprising:
   a handle, wherein the power source is positioned in the handle;
   a shaving razor cartridge mounted to the handle; and
   a first thermal control circuit and a second thermal control circuit, wherein the first thermal control circuit comprises at least one of the plurality of switching elements and at least one of the plurality of sensors and the second thermal control circuit comprises at least a different one of the plurality of switching elements and at least a different one of the plurality of sensors.

* * * * *